(12) United States Patent
Lee

(10) Patent No.: US 11,048,602 B2
(45) Date of Patent: Jun. 29, 2021

(54) ELECTRONIC DEVICES

(71) Applicant: SK hynix Inc., Icheon-si (KR)

(72) Inventor: Jae In Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 68 days.

(21) Appl. No.: 16/723,908

(22) Filed: Dec. 20, 2019

(65) Prior Publication Data

US 2020/0125445 A1 Apr. 23, 2020

Related U.S. Application Data

(63) Continuation-in-part of application No. 15/947,438, filed on Apr. 6, 2018, now Pat. No. 10,552,277.

(30) Foreign Application Priority Data

Oct. 17, 2017 (KR) .................. 10-2017-0134860

(51) Int. Cl.
| | |
|---|---|
| *G06F 11/22* | (2006.01) |
| *G06F 11/10* | (2006.01) |
| *H03M 13/19* | (2006.01) |
| *G06F 11/07* | (2006.01) |

(52) U.S. Cl.
CPC ........ *G06F 11/2215* (2013.01); *G06F 11/073* (2013.01); *G06F 11/1012* (2013.01); *G06F 11/1076* (2013.01); *H03M 13/19* (2013.01)

(58) Field of Classification Search
CPC ... G06F 11/2215; G06F 11/1012; G11C 29/02
See application file for complete search history.

(56) References Cited

U.S. PATENT DOCUMENTS

| | | | | |
|---|---|---|---|---|
| 4,740,968 | A * | 4/1988 | Aichelmann, Jr. | ............................ G06F 11/1012 714/703 |
| 4,809,273 | A * | 2/1989 | Jackowski | .......... G06F 11/2215 714/703 |
| 4,926,426 | A * | 5/1990 | Scheuneman | ....... G06F 11/1008 714/764 |
| 5,502,732 | A * | 3/1996 | Arroyo | ............... G06F 11/2215 714/703 |
| 6,469,642 | B1 * | 10/2002 | Kreppold | ............... F16H 59/105 200/6 A |
| 6,799,287 | B1 * | 9/2004 | Sharma | ................. H03M 13/47 714/703 |
| 8,694,862 | B2 * | 4/2014 | Sazeides | ............. H03M 13/033 714/766 |
| 9,984,766 | B1 * | 5/2018 | Becker | ................... G11C 29/16 |

(Continued)

FOREIGN PATENT DOCUMENTS

KR  1020160145503 A  12/2016

*Primary Examiner* — Steve N Nguyen
(74) *Attorney, Agent, or Firm* — William Park & Associates Ltd.

(57) ABSTRACT

An electronic device includes a syndrome decoder, an error insertion control circuit, and a failure detection circuit. The syndrome decoder generates an error insertion code from a write syndrome generated based on a write pulse. The error insertion control circuit inserts an error into an internal codeword according to the error insertion code based on a read pulse. The failure detection circuit compares the write syndrome with a read syndrome generated from the internal codeword to generate a failure detection signal.

17 Claims, 20 Drawing Sheets

(56) References Cited

U.S. PATENT DOCUMENTS

| | | | |
|---|---|---|---|
| 2009/0249148 A1* | 10/2009 | Ito | G06F 11/1008 |
| | | | 714/746 |
| 2013/0346798 A1* | 12/2013 | Moyer | G06F 11/2215 |
| | | | 714/27 |
| 2016/0292059 A1* | 10/2016 | Catherwood | G06F 11/10 |
| 2017/0222752 A1* | 8/2017 | Hamada | H04L 1/0057 |
| 2018/0331692 A1* | 11/2018 | Gulati | G06F 11/2215 |

* cited by examiner

FIG.5

|   | EI<3> | EI<2> | EI<1> |
|---|-------|-------|-------|
| 1 | 0 | 0 | 1 |
| 2 | 0 | 1 | 0 |
| 3 | 0 | 1 | 1 |
| 4 | 1 | 0 | 0 |
| 5 | 1 | 0 | 1 |
| 6 | 1 | 1 | 0 |
| 7 | 1 | 1 | 1 |

ELECTRONIC DEVICES

CROSS-REFERENCE TO RELATED APPLICATIONS

This application is a continuation-in-part of U.S. patent application Ser. No. 15/947,438, filed on Apr. 6, 2018, which claims the priority of Korean Patent Application No. 10-2017-0134860, filed on Oct. 17, 2017 in the Korean Intellectual Property Office.

BACKGROUND

1. Technical Field

Embodiments of the present disclosure generally relate to electronic devices, and more particularly to electronic devices using an error correction.

2. Related Art

Recently, a DDR2 scheme or a DDR3 scheme receiving and outputting four-bit data or eight-bit data during each clock cycle time has been used to improve the operation speeds of semiconductor devices. If a data transmission speed of the semiconductor devices increases, then the probability of errors occurring may increase as well when data is transmitted with the semiconductor devices. Accordingly, novel design schemes have been proposed to improve the reliability of the data transmissions.

Whenever data is transmitted in semiconductor devices, error codes which are capable of detecting the occurrence of errors may be generated and transmitted with the data to guarantee the reliability of data transmission. The error codes may include an error detection code (EDC) which is capable of detecting errors and an error correction code (ECC) which is capable of correcting the errors by itself.

SUMMARY

According to an embodiment, an electronic device includes a syndrome decoder, an error insertion control circuit, and a failure detection circuit. The syndrome decoder is configured to generate an error insertion code from a write syndrome generated based on a write pulse. The error insertion control circuit is configured to insert an error into an internal codeword according to the error insertion code based on a read pulse. The failure detection circuit is configured to compare the write syndrome with a read syndrome generated from the internal codeword to generate a failure detection signal.

According to another embodiment, an electronic device includes a syndrome decoder, an error insertion control circuit, a read syndrome generation circuit, and a failure detection circuit. The syndrome decoder is configured to generate an error insertion code from a write syndrome generated by counting a write pulse. The error insertion control circuit is configured to invert a level of at least one bit included in an internal codeword according to the error insertion code based on a read pulse. The read syndrome generation circuit is configured to generate a read syndrome from data and a parity included in the internal codeword. The failure detection circuit is configured to compare the write syndrome with the read syndrome to generate a failure detection signal.

According to still another embodiment, an electronic device includes a first detection signal generation circuit, a second detection signal generation circuit, and a detection signal output circuit. The first detection signal generation circuit is configured to generate an error insertion code from a write syndrome generated based on a write pulse, configured to insert an error into a first internal codeword according to the error insertion code based on a read pulse, and configured to compare the write syndrome with a first read syndrome generated from the first internal codeword to generate a first failure detection signal. The second detection signal generation circuit is configured to insert an error into a second internal codeword according to the error insertion code based on the read pulse and configured to compare the write syndrome with a second read syndrome generated from the second internal codeword to generate a second failure detection signal. The detection signal output circuit is configured to sequentially output the first and second failure detection signals to at least one pad.

BRIEF DESCRIPTION OF THE DRAWINGS

FIG. 5 is a table illustrating various logic level combinations of an error insertion code generated by the error occurrence control circuit illustrated in FIG. 4.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

For reference, an embodiment including additional components may be provided. Furthermore, a logic high or logic low configuration indicating a state of a signal or circuit may be changed depending on embodiments. Furthermore, the configuration of a logic gate or logic gates required for implementing the same function or operation may be modified. That is, the logic gate configuration of one type of operation and another logic gate configuration for the same type of operation may be replaced with each other, depending on a specific situation. If necessary, various logic gates may be applied to implement the configurations.

Various embodiments may be directed to electronic devices configured to verify error correction codes.

Figure 1:
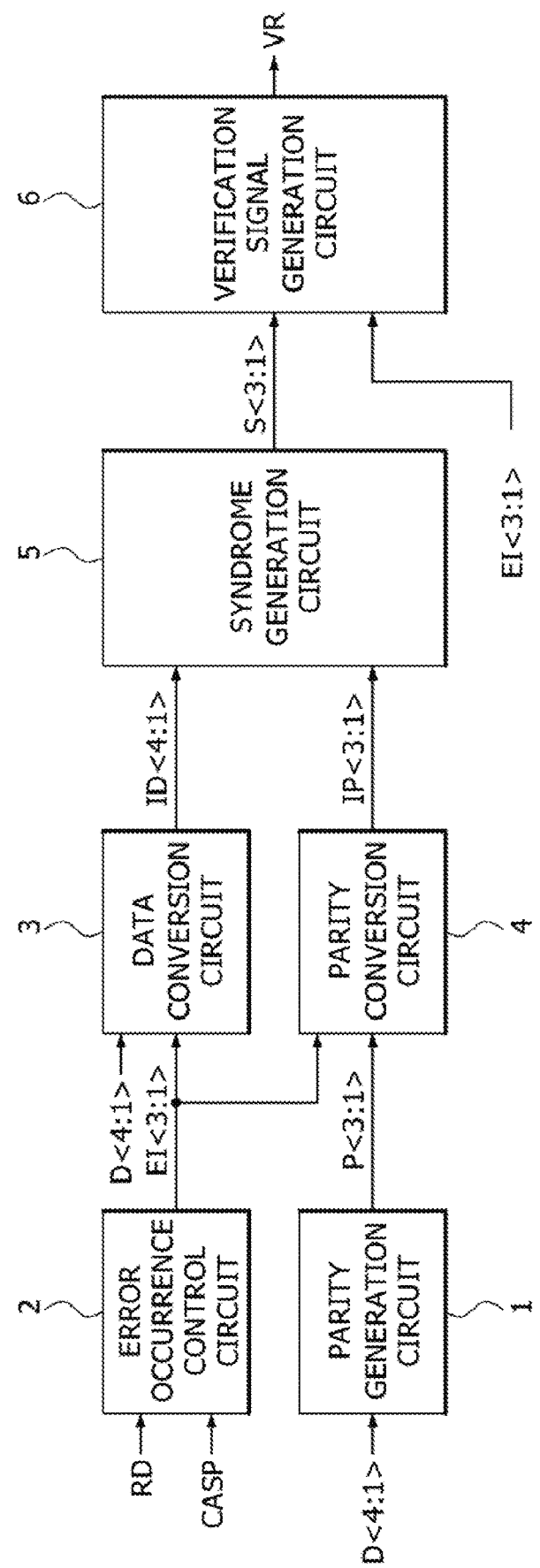
FIG. 1 is a block diagram illustrating a configuration of an electronic device according to an embodiment of the present disclosure.

Referring to FIG. 1, an electronic device according to an embodiment may include a parity generation circuit 1, an error occurrence control circuit 2, a data conversion circuit 3, a parity conversion circuit 4, a syndrome generation circuit 5 and a verification signal generation circuit 6.

The parity generation circuit 1 may receive data D<4:1> to generate a parity P<3:1>. The parity generation circuit 1 may perform a selective logical operation on bits included in the data D<4:1> to generate the parity P<3:1>. The parity P<3:1> may be generated by an error correction code (ECC) circuit using a Hamming code. The Hamming code may be realized by an error check matrix for correcting errors of data. A configuration and an operation of the parity generation circuit 1 will be described with reference to FIGS. 2 and 3 later.

The error occurrence control circuit 2 may generate an error insertion code EI<3:1> in response to a read signal RD and a column pulse CASP. The error occurrence control circuit 2 may generate the error insertion code EI<3:1> which is counted at a point of time that the column pulse CASP is created while the read signal RD is enabled. The read signal RD may be enabled to perform a read operation. The column pulse CASP may be created whenever the data D<4:1> are outputted from a memory cell array (not illustrated) during the read operation. A configuration and an operation of the error occurrence control circuit 2 will be described with reference to FIGS. 4 and 5 later.

The data conversion circuit 3 may generate internal data ID<4:1> from the data D<4:1> in response to the error insertion code EI<3:1>. The data conversion circuit 3 may generate the internal data ID<4:1> by inverting a logic level of a bit corresponding to a logic level combination of the error insertion code EI<3:1> among bits included in the data D<4:1>. The bit of the data D<4:1> corresponding to each logic level combination of the error insertion code EI<3:1> may be set to be different according to the embodiments. A configuration and an operation of the data conversion circuit 3 will be described with reference to FIG. 6 later.

The parity conversion circuit 4 may generate an internal parity IP<3:1> from the parity P<3:1> in response to the error insertion code EI<3:1>. The parity conversion circuit 4 may generate the internal parity IP<3:1> by inverting a logic level of a bit corresponding to a logic level combination of the error insertion code EI<3:1> among bits included in the parity P<3:1>. The bit of the parity P<3:1> corresponding to each logic level combination of the error insertion code EI<3:1> may be set to be different according to the embodiments. A configuration and an operation of the parity conversion circuit 4 will be described with reference to FIG. 7 later.

The syndrome generation circuit 5 may generate a syndrome signal S<3:1> in response to the internal data ID<4:1> and the internal parity IP<3:1>. The syndrome generation circuit 5 may perform a logical operation on bits included in the internal data ID<4:1> and the internal parity IP<3:1> to generate the syndrome signal S<3:1>. The syndrome signal S<3:1> may be generated by an error correction code (ECC) circuit using a Hamming code. The Hamming code may be realized by an error check matrix for correcting errors of data. A configuration and an operation of the syndrome generation circuit 5 will be described with reference to FIG. 8 later.

The verification signal generation circuit 6 may generate a verification signal VR in response to the error insertion code EI<3:1> and the syndrome signal S<3:1>. The verification signal generation circuit 6 may generate the verification signal VR having a first logic level if the error insertion code EI<3:1> is the same as the syndrome signal S<3:1>. The verification signal generation circuit 6 may generate the verification signal VR having a second logic level if the error insertion code EI<3:1> is different from the syndrome signal S<3:1>. The first logic level of the verification signal VR may be set to be a logic "high" level, and the second logic level of the verification signal VR may be set to be a logic "low" level. In some other embodiments, the first logic level of the verification signal VR may be set to be a logic "low" level, and the second logic level of the verification signal VR may be set to be a logic "high" level. A configuration and an operation of the verification signal generation circuit 6 will be described with reference to FIG. 9 later.

Figure 2:
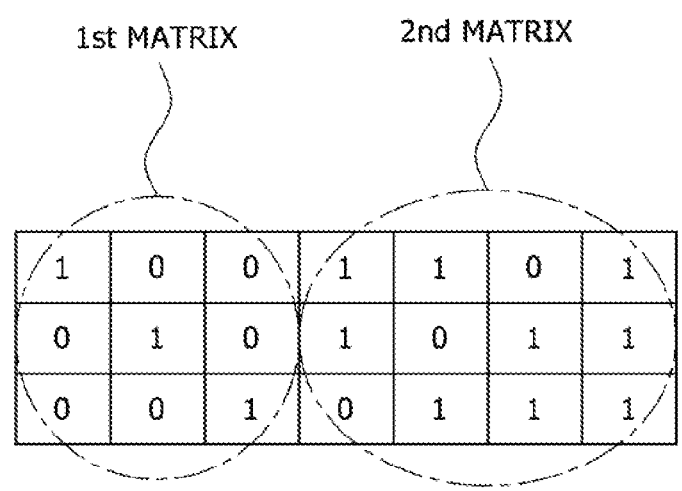
FIG. 2 is a table illustrating an example of an error check matrix for realizing error correction codes used in the electronic device of FIG. 1.

Referring to FIG. 2, an error check matrix used in an electronic device according to an embodiment is illustrated. The error check matrix used in the electronic device according to an embodiment may include a first matrix 1st MATRIX and a second matrix 2nd MATRIX.

The first matrix 1st MATRIX may include information on whether bits of the parity P<3:1> have an error. If the syndrome signal S<3:1> is generated to have a logic level combination of '0,0,1' which is identical to a logic level combination of a first column of the first matrix 1st MATRIX, a first bit P<1> of the parity P<3:1> may be regarded as an erroneous bit. In the syndrome signal S<3:1>, the logic level combination of '0,0,1' means that a first bit S<1> of the syndrome signal S<3:1> has a logic "high" level and both of second and third bits S<2:3> of the syndrome signal S<3:1> have a logic "low" level. If the syndrome signal S<3:1> is generated to have a logic level combination of '0,1,0' which is identical to a logic level combination of a second column of the first matrix 1st MATRIX, a second bit P<2> of the parity P<3:1> may be regarded as an erroneous bit. If the syndrome signal S<3:1> is generated to have a logic level combination of '1,0,0' which is identical to a logic level combination of a third column of the first matrix 1st MATRIX, a third bit P<3> of the parity P<3:1> may be regarded as an erroneous bit. Hereinafter, a logic level having a value of '1' may means a logic "high" level, and a logic level having a value of '0' may means a logic "low" level.

The second matrix 2nd MATRIX may include information on whether bits of the data D<4:1> are erroneous bits. If the syndrome signal S<3:1> is generated to have a logic level combination of '0,1,1' which is identical to a logic level combination of a first column of the second matrix 2nd MATRIX, a first bit D<1> of the data D<4:1> may be regarded as an erroneous bit. If the syndrome signal S<3:1> is generated to have a logic level combination of '1,0,1' which is identical to a logic level combination of a second column of the second matrix 2nd MATRIX, a second bit D<2> of the data D<4:1> may be regarded as an erroneous bit. If the syndrome signal S<3:1> is generated to have a logic level combination of '1,1,0' which is identical to a logic level combination of a third column of the second matrix 2nd MATRIX, a third bit D<3> of the data D<4:1> may be regarded as an erroneous bit. If the syndrome signal S<3:1> is generated to have a logic level combination of '1,1,1' which is identical to a logic level combination of a fourth column of the second matrix 2nd MATRIX, a fourth bit D<4> of the data D<4:1> may be regarded as an erroneous bit.

The second matrix 2nd MATRIX may include information on logic level combinations of bits included in the data <4:1> in order to generate the parity P<3:1>. Since a first row of the second matrix 2nd MATRIX has a logic level combination of '1,1,0,1', a logic level of the first bit P<1> of the parity P<3:1> may be generated by an exclusive logical operation of the first bit D<1>, the second bit D<2> and the fourth bit <D4> of the data D<4:1>. Since a second row of the second matrix 2nd MATRIX has a logic level combination of 1,0,1,1', a logic level of the second bit P<2> of the parity P<3:1> may be generated by an exclusive logical operation of the first bit D<1>, the third bit D<3> and the fourth bit <D4> of the data D<4:1>. Since a third row of the second matrix 2nd MATRIX has a logic level combination of '0,1,1,1', a logic level of the third bit P<3> of the parity P<3:1> may be generated by an exclusive logical operation of the second bit D<2>, the third bit D<3> and the fourth bit <D4> of the data D<4:1>.

Figure 3:
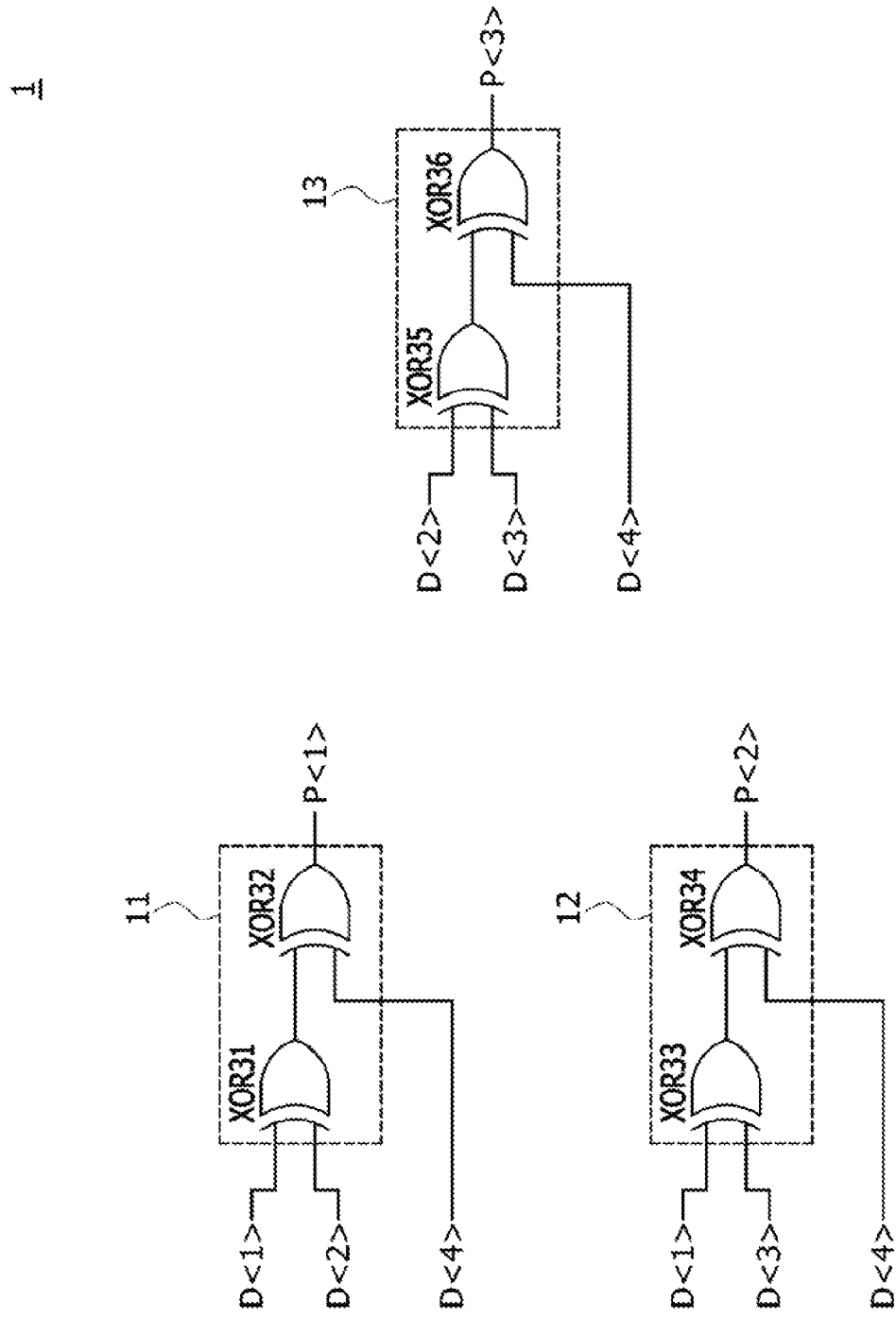
FIG. 3 is a circuit diagram illustrating an example of a parity generation circuit included in the electronic device of FIG. 1.

Referring to FIG. 3, the parity generation circuit 1 may include a first parity generation circuit 11, a second parity generation circuit 12 and a third parity generation circuit 13. The first parity generation circuit 11 may perform an exclusive logical operation of the first bit D<1>, the second bit D<2> and the fourth bit D<4> of the data D<4:1> to generate the first bit P<1> of the parity P<3:1> since the first row of the second matrix 2nd MATRIX illustrated in FIG. 2 has a logic level combination of '1,1,0,1'. The second parity generation circuit 12 may perform an exclusive logical operation of the first bit D<1>, the third bit D<3> and the fourth bit D<4> of the data D<4:1> to generate the second bit P<2> of the parity P<3:1> since the second row of the second matrix 2nd MATRIX illustrated in FIG. 2 has a logic level combination of '1,0,1,1'. The third parity generation circuit 13 may perform an exclusive logical operation of the second bit D<2>, the third bit D<3> and the fourth bit D<4> of the data D<4:1> to generate the third bit P<3> of the parity P<3:1> since the third row of the second matrix 2nd MATRIX illustrated in FIG. 2 has a logic level combination of '0,1,1,1'. In an embodiment, for example, the first parity generation circuit 11 may include logic gates for performing the exclusive OR operations. For example, the first parity generation circuit 11 may include exclusive OR gates XOR31 and XOR32. The exclusive OR gate XOR31 may be configured to receive and perform an exclusive OR operation on the first and second bits D<1:2>, and output a resultant signal. The exclusive OR gate XOR32 may be configured to receive and perform an exclusive OR operation on the fourth bit D<4> and the resultant signal, and output the first bit P<1>. The second parity generation circuit 12 may include, for example, exclusive OR gates XOR33 and XOR34. The second parity generation circuit 12 may be configured in the same way as the first parity generation circuit 11 except that the designations of the signals inputted thereto and outputted therefrom are different. The third parity generation circuit 13 may include, for example, exclusive OR gates XOR35 and XOR36. The third parity generation circuit 13 may be configured in the same way as the first parity generation circuit 11 except that the designations of the signals inputted thereto and outputted therefrom are different.

Figure 4:
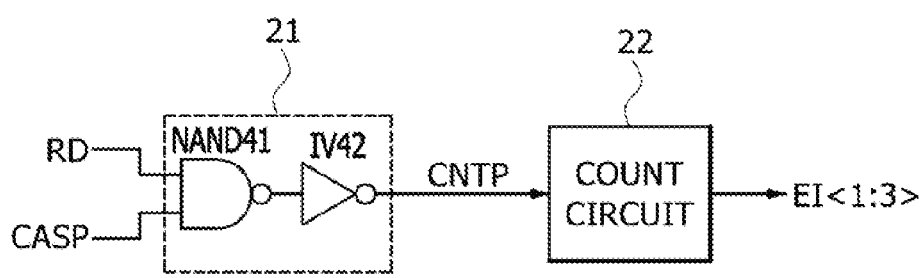
FIG. 4 illustrates an example of an error occurrence control circuit included in the electronic device of FIG. 1.

Referring to FIG. 4, the error occurrence control circuit 2 may include a count pulse generation circuit 21 and a count circuit 22. The count pulse generation circuit 21 may generate a count pulse CNTP in response to the read signal RD and the column pulse CASP. The count pulse generation circuit 21 may generate the count pulse CNTP whenever the column pulse CASP is created by the data D<4:1> outputted from a memory cell array (not illustrated) while the read signal RD is enabled to perform the read operation. In an embodiment, for example, the count pulse generation circuit 21 may be configured to perform a NAND logic operation on the read signal RD and the column pulse signal CASP, output a resultant signal, and perform an inversion operation on the resultant signal to output the count pulse CNTP. For example, the count pulse generation circuit 21 may include a NAND gate NAND41 and an inverter IV42. The NAND gate NAND41 may perform a NAND operation on the read signal RD and the column pulse CASP, and output a resultant signal. The inverter IV42 may invert the resultant signal and output the count pulse CNTP. The count circuit 22 may generate the error insertion code EI<3:1> that is sequentially counted whenever the count pulse CNTP is created.

Referring to FIG. 5, various logic level combinations of the error insertion code EI<3:1> generated by the error occurrence control circuit 2 of FIG. 4 are illustrated. The error insertion code EI<3:1> may be counted to have a logic level combination of '0,0,1' if a first one of the count pulse CNTP is created while the error insertion code EI<3:1> has a logic level combination of '0,0,0'. In the error insertion code EI<3:1>, the logic level combination of '0,0,1' means that the first bit EI<1> of the error insertion code EI<3:1> has a logic "high' level and both of the second and third bits EI<3:2> of the error insertion code EI<3:1> has a logic "low' level. The error insertion code EI<3:1> may be counted to have a logic level combination of '0,1,0' if a second one of the count pulse CNTP is created, and the error insertion code EI<3:1> may be counted to have a logic level combination of '0,1,1' if a third one of the count pulse CNTP is created. In addition, the error insertion code EI<3:1> may be counted to have a logic level combination of '1,0,0' if a fourth one of the count pulse CNTP is created, and the error insertion code EI<3:1> may be counted to have a logic level combination of '1,0,1' if a fifth one of the count pulse CNTP is created. Moreover, the error insertion code EI<3:1> may be counted to have a logic level combination of '1,1,0' if a sixth one of the count pulse CNTP is created, and the error insertion code EI<3:1> may be counted to have a logic level combination of '1,1,1' if a seventh one of the count pulse CNTP is created.

A logic level combination of '0,0,1' in the error insertion code EI<3:1> may be identical to a logic level combination of the syndrome signal S<3:1> generated when the first bit P<1> of the parity P<3:1> is an erroneous bit. A logic level combination of '0,1,0' in the error insertion code EI<3:1> may be identical to a logic level combination of the syndrome signal S<3:1> generated when the second bit P<2> of the parity P<3:1> is an erroneous bit. A logic level combination of '0,1,1' in the error insertion code EI<3:1> may be identical to a logic level combination of the syndrome signal S<3:1> generated when the first bit D<1> of the data D<4:1> is an erroneous bit. A logic level combination of '1,0,0' in the error insertion code EI<3:1> may be identical to a logic level combination of the syndrome signal S<3:1> generated when the third bit P<3> of the parity P<3:1> is an erroneous bit. A logic level combination of '1,0,1' in the error insertion code EI<3:1> may be identical to a logic level combination of the syndrome signal S<3:1> generated when the second bit D<2> of the data D<4:1> is an erroneous bit. A logic level combination of '1,1,0' in the error insertion code EI<3:1> may be identical to a logic level combination of the syndrome signal S<3:1> generated when the third bit D<3> of the data D<4:1> is an erroneous bit. A logic level combination of '1,1,1' in the error insertion code EI<3:1> may be identical to a logic level combination of the syndrome signal S<3:1> generated when the fourth bit D<4> of the data D<4:1> is an erroneous bit.

Figure 6:
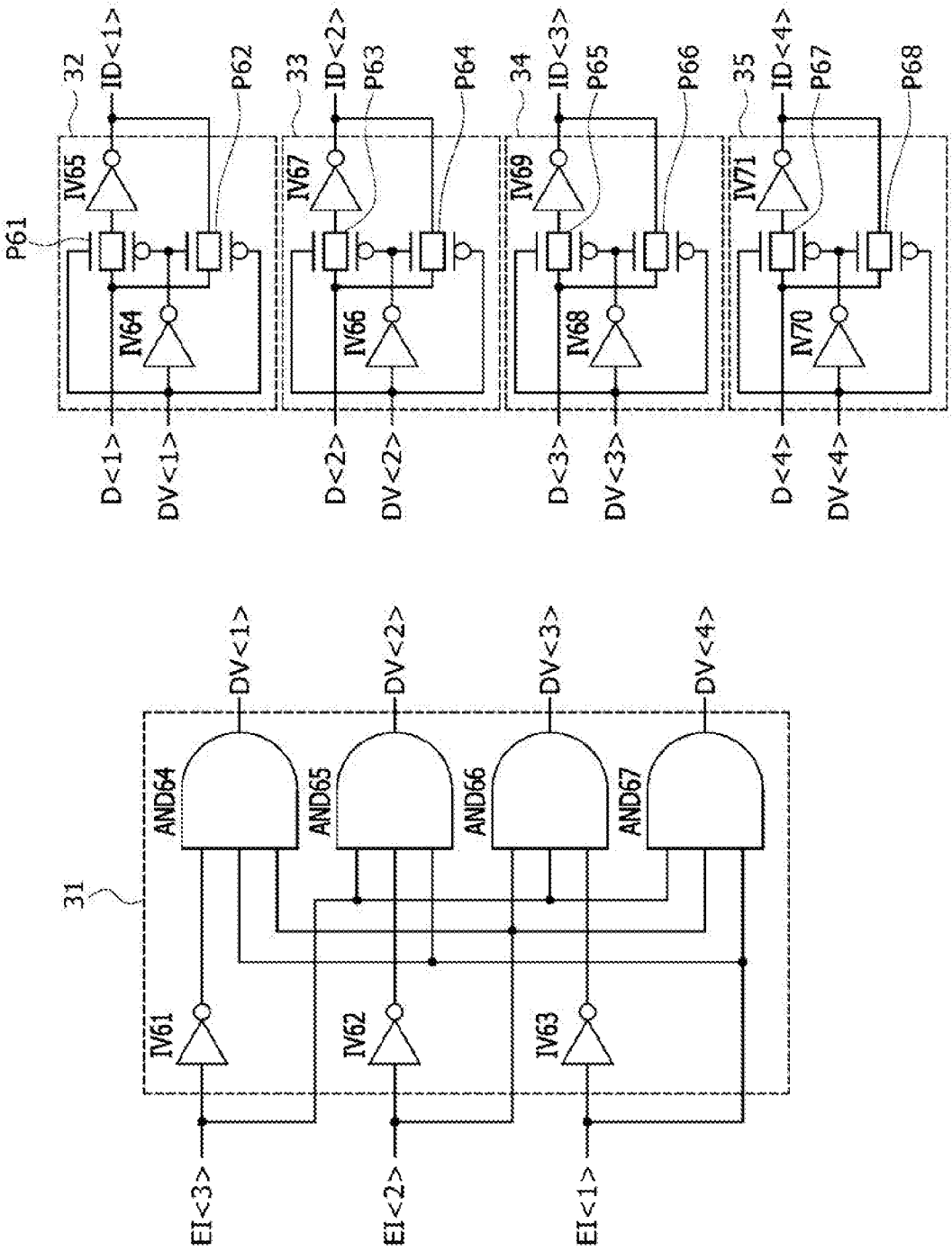
FIG. 6 is a circuit diagram illustrating an example of a data conversion circuit included in the electronic device of FIG. 1.

Referring to FIG. 6, the data conversion circuit 3 may include a data conversion signal generation circuit 31, a first internal data generation circuit 32, a second internal data generation circuit 33, a third internal data generation circuit 34 and a fourth internal data generation circuit 35.

The data conversion signal generation circuit 31 may generate a first conversion datum DV<1> having a logic "high" level when the error insertion code EI<3:1> has a logic level combination of '0,1,1'. The data conversion signal generation circuit 31 may generate a second conversion datum DV<2> having a logic "high" level when the error insertion code EI<3:1> has a logic level combination of '1,0,1'. The data conversion signal generation circuit 31 may generate a third conversion datum DV<3> having a logic "high" level when the error insertion code EI<3:1> has a logic level combination of '1,1,0'. The data conversion signal generation circuit 31 may generate a fourth conversion datum DV<4> having a logic "high" level when the error insertion code EI<3:1> has a logic level combination of '1,1,1'. In an embodiment, for example, the data conversion signal generation circuit 31 may be configured to perform AND operations and inversion operations on the error insertion code EI<3:1>. For example, data conversion signal generation circuit 31 may include inverters IV61, IV62, and IV63, and AND gates AND64-AND67. For example, the inverter IV61 may invert the bit EI<3> and output a resultant signal, and the AND gate AND64 may perform an AND operation with the resultant signal and the bits EI<2> and EI<1> to output the first conversion datum DV<1>. For example, the inverter IV62 may invert the bit EI<2> and output a resultant signal, and the AND gate AND65 may perform an AND operation with the resultant signal and bits EI<3> and EI<1> to output the second conversion datum DV<2>. For example, the inverter IV63 may invert the bit EI<1> and output a resultant signal, and the AND gate AND66 may perform an AND operation with the resultant signal and bits EI<2> and EI<3> to output the third conversion datum DV<3>. For example, the AND gate AND67 may perform an AND operation with error insertion code EI<3:1> to output the fourth conversion datum DV<4>.

The first internal data generation circuit 32 may invert a logic level of the first bit D<1> of the data D<4:1> to generate a first bit ID<1> of the internal data ID<4:1> if the first conversion datum DV<1> has a logic "high" level. If the first conversion datum DV<1> has a logic "high" level due to the error insertion code EI<3:1> having a logic level combination of '0,1,1', the first internal data generation circuit 32 may invert a logic level of the first bit D<1> of the data D<4:1> to cause an error of the first bit ID<1> of the internal data ID<4:1>. In an embodiment, for example, the first internal data generation circuit 32 may include inverters IV64 and IV65, and pass gates PG1 and PG2. The inverter IV64 may be inputted with the first conversion datum DV<1> and output a resultant signal. The pass gate PG1 may have an input terminal which is inputted with the first bit D<1>, a first control terminal which is inputted with the first conversion datum DV<1>, a second control terminal which is inputted with the resultant signal from the inverter IV64, and an output terminal which outputs a resultant signal. The inverter IV65 may be inputted with the resultant signal output from the pass gate PG1 and output the first bit ID<1> of the internal data ID<4:1>. The pass gate PG2 may have an input terminal which is inputted with the first bit D<1>, a first control terminal which is inputted with the resultant signal outputted from the inverter IV64, a second control terminal which is inputted with the first conversion datum DV<1>, and an output terminal which outputs the first bit ID<1> of the internal data ID<4:1>.

The second internal data generation circuit 33 may invert a logic level of the second bit D<2> of the data D<4:1> to generate a second bit ID<2> of the internal data ID<4:1> if the second conversion datum DV<2> has a logic "high" level. If the second conversion datum DV<2> has a logic "high" level due to the error insertion code EI<3:1> having a logic level combination of '1,0,1', the second internal data generation circuit 33 may invert a logic level of the second bit D<2> of the data D<4:1> to cause an error of the second bit ID<2> of the internal data ID<4:1>. The second internal data generation circuit 33 may include inverters IV66 and IV67 and pass gates PG3 and PG4. The second internal data generation circuit 33 may be configured in the same way as the first internal data generation circuit 32 except that the designations of the signals inputted thereto and outputted therefrom are different.

The third internal data generation circuit 34 may invert a logic level of the third bit D<3> of the data D<4:1> to generate a third bit ID<3> of the internal data ID<4:1> if the third conversion datum DV<3> has a logic "high" level. If the third conversion datum DV<3> has a logic "high" level due to the error insertion code EI<3:1> having a logic level combination of '1,1,0', the third internal data generation circuit 34 may invert a logic level of the third bit D<3> of the data D<4:1> to cause an error of the third bit ID<3> of the internal data ID<4:1>. The third internal data generation circuit 34 may include inverters IV68 and IV69 and pass gates PG5 and PG6. The third internal data generation circuit 34 may be configured in the same way as the first internal data generation circuit 32 except that the designations of the signals inputted thereto and outputted therefrom are different.

The fourth internal data generation circuit 35 may invert a logic level of the fourth bit D<4> of the data D<4:1> to generate a fourth bit ID<4> of the internal data ID<4:1> if the fourth conversion datum DV<4> has a logic "high"

level. If the fourth conversion datum DV<4> has a logic "high" level due to the error insertion code EI<3:1> having a logic level combination of '1,1,1', the fourth internal data generation circuit 35 may invert a logic level of the fourth bit D<4> of the data D<4:1> to cause an error of the fourth bit ID<4> of the internal data ID<4:1>. The fourth internal data generation circuit 35 may include inverters IV70 and IV71 and pass gates PG7 and PG8. The fourth internal data generation circuit 35 may be configured in the same way as the first internal data generation circuit 32 except that the designations of the signals inputted thereto and outputted therefrom are different.

Figure 7:
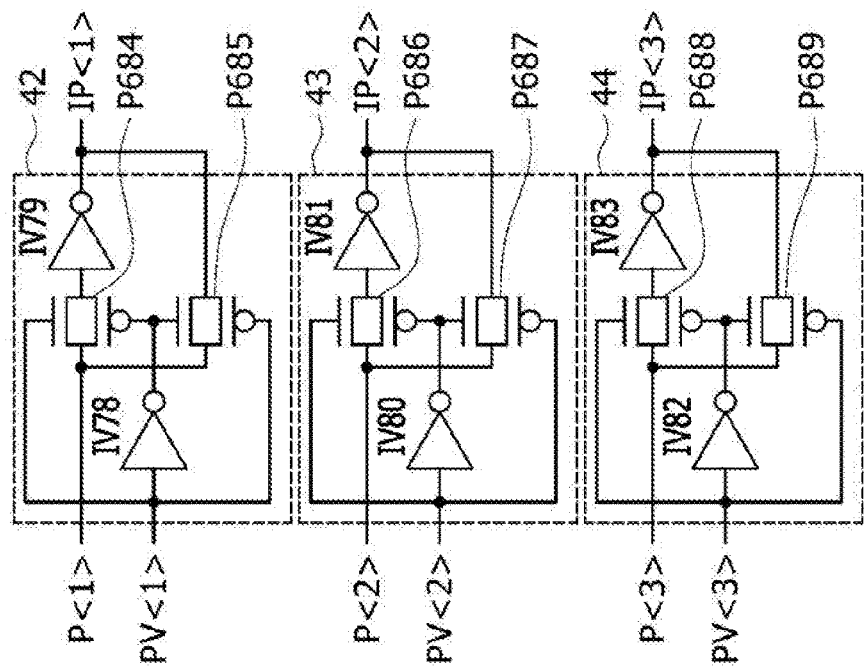
FIG. 7 is a circuit diagram illustrating an example of a parity conversion circuit included in the electronic device of FIG. 1.
Figure 7:
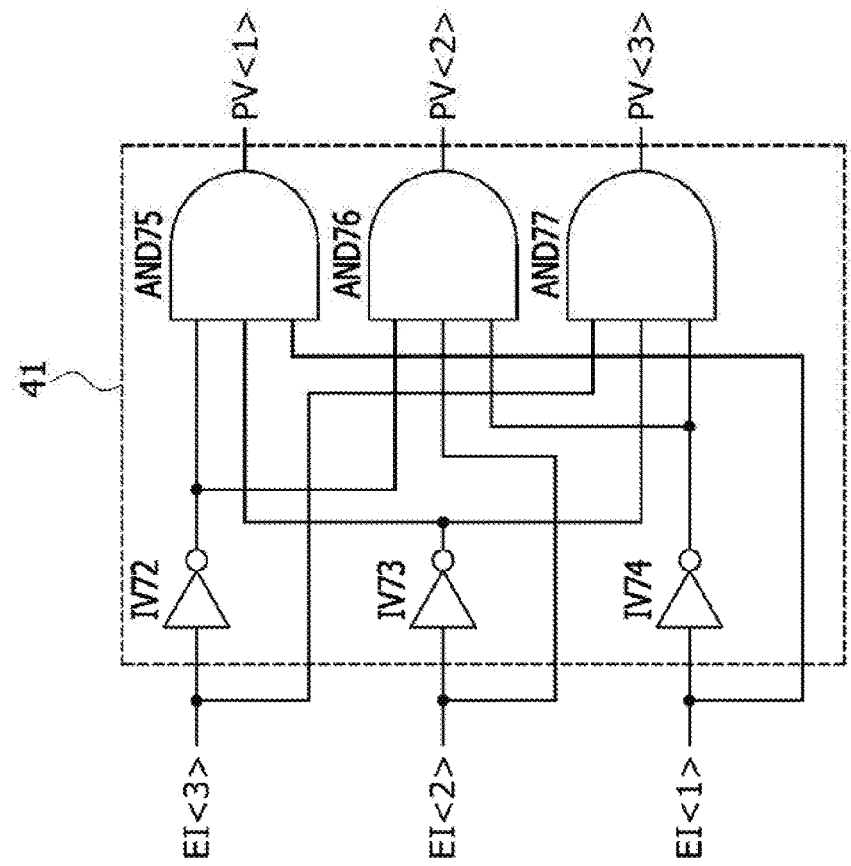

Referring to FIG. 7, the parity conversion circuit 4 may include a parity conversion signal generation circuit 41, a first internal parity generation circuit 42, a second internal parity generation circuit 43 and a third internal parity generation circuit 44.

The parity conversion signal generation circuit 41 may generate a first conversion parity PV<1> having a logic "high" level when the error insertion code EI<3:1> has a logic level combination of '0,0,1'. The parity conversion signal generation circuit 41 may generate a second conversion parity PV<2> having a logic "high" level when the error insertion code EI<3:1> has a logic level combination of '0,1,0'. The parity conversion signal generation circuit 41 may generate a third conversion parity PV<3> having a logic "high" level when the error insertion code EI<3:1> has a logic level combination of '1,0,0'. In an embodiment, for example, the parity conversion signal generation circuit 41 may be configured to perform AND operations and inversion operations on the error insertion code EI<3:1>. For example, parity conversion signal generation circuit 41 may include inverters IV72, IV73, and IV74, and AND gates AND75-AND77. For example, the inverter IV72 may invert the bit EI<3> and output a resultant signal, the inverter IV73 may invert the bit EI<2> and output a resultant signal, and the inverter IV74 may invert the bit EI<1> and output a resultant signal. The AND gate AND75 may perform an AND operation with the resultant signals of inverters IV72 and IV73 and bit EI<1> to output the first conversion parity PV<1>. The AND gate AND76 may perform an AND operation with the resultant signals of inverters IV72 and IV74 and bit EI<2> to output the second conversion parity PV<2>. The AND gate AND77 may perform an AND operation with the resultant signals of inverters IV73 and IV74 and bit EI<3> to output the first conversion parity PV<3>.

The first internal parity generation circuit 42 may invert a logic level of the first bit P<1> of the parity P<3:1> to generate a first bit IP<1> of the internal parity IP<3:1> if the first conversion parity PV<1> has a logic "high" level. If the first conversion parity PV<1> has a logic "high" level due to the error insertion code EI<3:1> having a logic level combination of '0,0,1', the first internal parity generation circuit 42 may invert a logic level of the first bit P<1> of the parity P<3:1> to cause an error of the first bit IP<1> of the internal parity IP<3:1>. In an embodiment, for example, the first internal parity generation circuit 42 may include inverters IV78 and IV79, and pass gates PG84 and PG85. The inverter IV78 may be inputted with the first conversion parity PV<1> and output a resultant signal. The pass gate PG84 may have an input terminal which is inputted with the first bit P<1>, a first control terminal which is inputted with the first conversion parity PV<1>, a second control terminal which is inputted with the resultant signal from the inverter IV78, and an output terminal which outputs a resultant signal. The inverter IV79 may be inputted with the resultant signal output from the pass gate PG84 and output the first bit IP<1> of the internal parity IP<3:1>. The pass gate PG85 may have an input terminal which is inputted with the first bit P<1>, a first control terminal which is inputted with the resultant signal outputted from the inverter IV78, a second control terminal which is inputted with the first conversion parity PV<1>, and an output terminal which outputs the first bit IP<1> of the internal data IP<3:1>.

The second internal parity generation circuit 43 may invert a logic level of the second bit P<2> of the parity P<3:1> to generate a second bit IP<2> of the internal parity IP<3:1> if the second conversion parity PV<2> has a logic "high" level. If the second conversion parity PV<2> has a logic "high" level due to the error insertion code EI<3:1> having a logic level combination of '0,1,0', the second internal parity generation circuit 43 may invert a logic level of the second bit P<2> of the parity P<3:1> to cause an error of the second bit IP<2> of the internal parity IP<3:1>. The second internal parity generation circuit 42 may include inverters IV78 and IV79 and pass gates PG84 and PG85. The second internal parity generation circuit 43 may be configured in the same way as the first internal parity generation circuit 42 except that the designations of the signals inputted thereto and outputted therefrom are different.

The third internal parity generation circuit 44 may invert a logic level of the third bit P<3> of the parity P<3:1> to generate a third bit IP<3> of the internal parity IP<3:1> if the third conversion parity PV<3> has a logic "high" level. If the third conversion parity PV<3> has a logic "high" level due to the error insertion code EI<3:1> having a logic level combination of '1,0,0', the third internal parity generation circuit 44 may invert a logic level of the third bit P<3> of the parity P<3:1> to cause an error of the third bit IP<3> of the internal parity IP<3:1>. The third internal parity generation circuit 44 may include inverters IV82 and IV83 and pass gates PG88 and PG89. The third internal parity generation circuit 44 may be configured in the same way as the first internal parity generation circuit 42 except that the designations of the signals inputted thereto and outputted therefrom are different.

Figure 8:
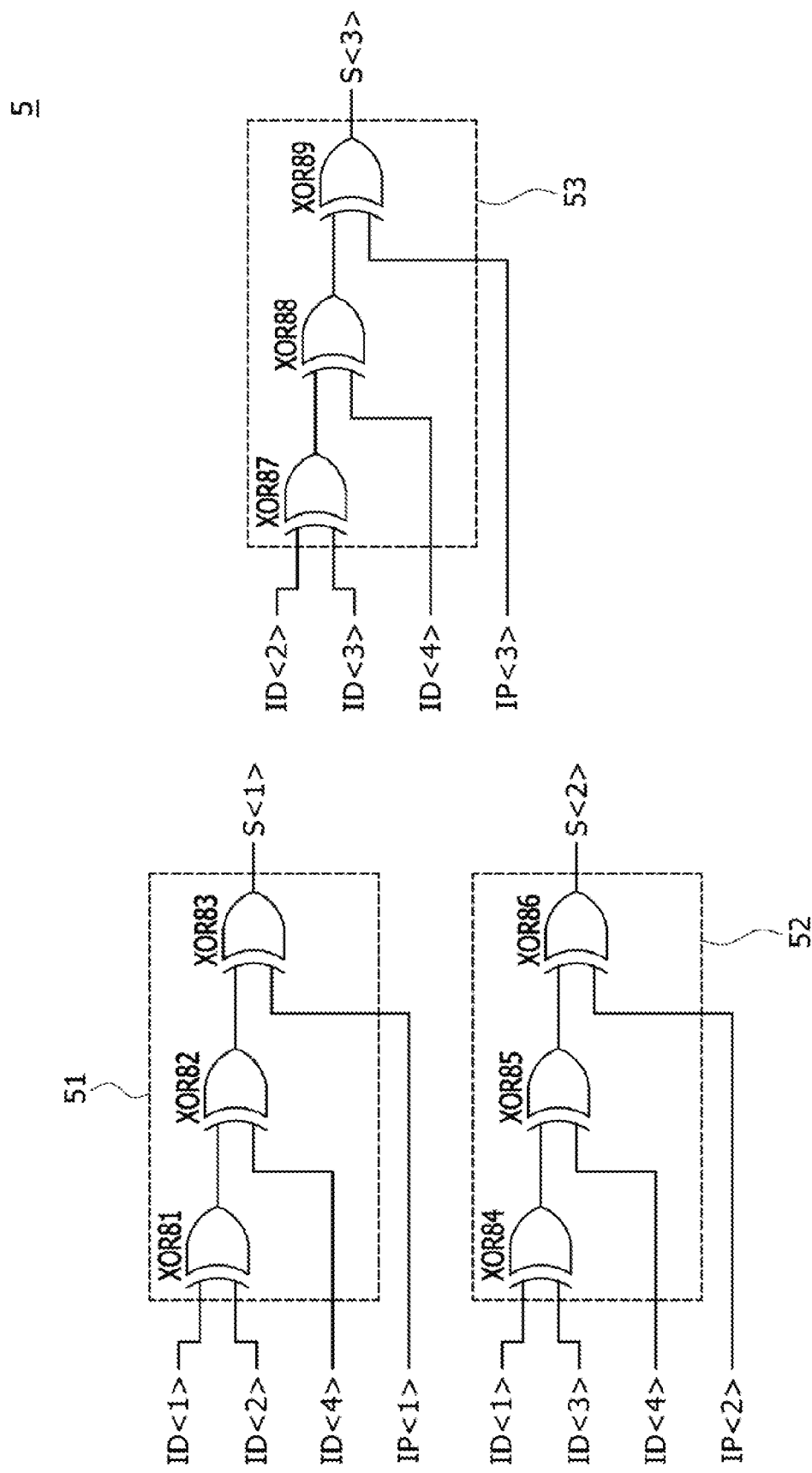
FIG. 8 is a circuit diagram illustrating an example of a syndrome generation circuit included in the electronic device of FIG. 1.

Referring to FIG. 8, the syndrome generation circuit 5 may include a first syndrome generation circuit 51, a second syndrome generation circuit 52 and a third syndrome generation circuit 53.

The first syndrome generation circuit 51 may perform an exclusive logical operation of the first bit ID<1> of the internal data ID<4:1>, the second bit ID<2> of the internal data ID<4:1>, the fourth bit ID<4> of the internal data ID<4:1>, and the first bit IP<1> of the internal parity IP<3:1> to generate a first bit S<1> of the syndrome signal S<3:1>. A logical operation equation for generating the first bit S<1> of the syndrome signal S<3:1> may be determined by a logic level combination of '1,0,0' in the first row of the first matrix 1st MATRIX and a logic level combination of '1,1,0,1' in the first row of the second matrix 2nd MATRIX. In an embodiment, for example, the first syndrome generation circuit 51 may include exclusive OR gates XOR81 to XOR83. The exclusive OR gate XOR81 may be inputted with the first and second bits ID<2:1> to output a resultant signal. The exclusive OR gate XOR82 may be inputted with the resultant signal outputted from the exclusive or gate XOR81 and the fourth bit ID<4> to output a resultant signal. The exclusive OR gate XOR83 may be inputted with the resultant signal outputted from the exclusive or gate XOR82 and the first bit IP<1> to output the first bit S<1> of the syndrome signal S<3:1>.

The second syndrome generation circuit 52 may perform an exclusive logical operation of the first bit ID<1> of the internal data ID<4:1>, the third bit ID<3> of the internal data ID<4:1>, the fourth bit ID<4> of the internal data ID<4:1>, and the second bit IP<2> of the internal parity IP<3:1> to generate a second bit S<2> of the syndrome signal S<3:1>. A logical operation equation for generating the second bit S<2> of the syndrome signal S<3:1> may be determined by a logic level combination of '0,1,0' in the second row of the first matrix 1st MATRIX and a logic level combination of 1,0,1,1' in the second row of the second matrix 2nd MATRIX. The second syndrome generation circuit 52 may include exclusive OR gates XOR84 to XOR86. The second syndrome generation circuit 52 may be configured in the same way as the first syndrome generation circuit 51 except that the designations of the signals inputted thereto and outputted therefrom are different.

The third syndrome generation circuit 53 may perform an exclusive logical operation of the second bit ID<2> of the internal data ID<4:1>, the third bit ID<3> of the internal data ID<4:1>, the fourth bit ID<4> of the internal data ID<4:1>, and the third bit IP<3> of the internal parity IP<3:1> to generate a third bit S<3> of the syndrome signal S<3:1>. A logical operation equation for generating the third bit S<3> of the syndrome signal S<3:1> may be determined by a logic level combination of '0,0,1' in the third row of the first matrix 1st MATRIX and a logic level combination of '0,1,1,1' in the third row of the second matrix 2nd MATRIX. The third syndrome generation circuit 53 may include exclusive OR gates XOR87 to XOR89. The third syndrome generation circuit 53 may be configured in the same way as the first syndrome generation circuit 51 except that the designations of the signals inputted thereto and outputted therefrom are different.

Figure 9:
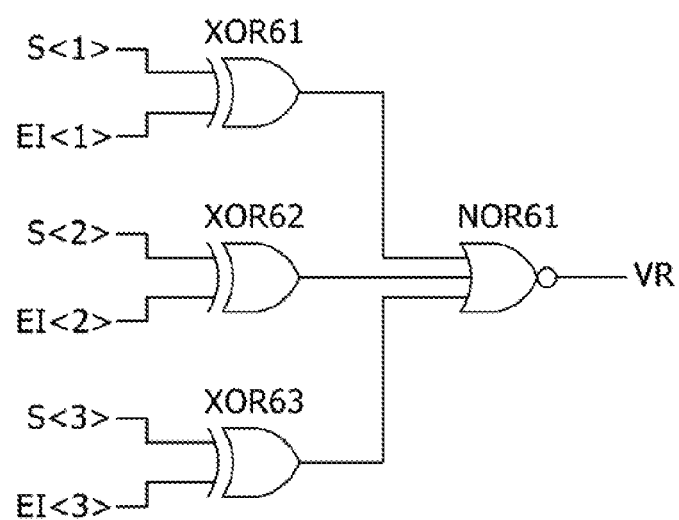
FIG. 9 is a circuit diagram illustrating an example of a verification signal generation circuit included in the electronic device of FIG. 1.

Referring to FIG. 9, the verification signal generation circuit 6 may include logic gates for performing exclusive OR operations, for example but not limited to, exclusive OR gates XOR61, XOR62 and XOR63. The verification signal generation circuit 6 may include logic gates for performing a NOR operation, for example but not limited to, a NOR gate NOR61. The exclusive OR gate XOR61 may perform an exclusive OR operation of the first bit S<1> of the syndrome signal S<3:1> and the first bit EI<1> of the error insertion code EI<3:1>. The exclusive OR gate XOR61 may output a signal having a logic "low" level if the first bit S<1> of the syndrome signal S<3:1> and the first bit EI<1> of the error insertion code EI<3:1> have the same logic level and may output a signal having a logic "high" level if the first bit S<1> of the syndrome signal S<3:1> and the first bit EI<1> of the error insertion code EI<3:1> have different logic levels. The exclusive OR gate XOR62 may perform an exclusive OR operation of the second bit S<2> of the syndrome signal S<3:1> and the second bit EI<2> of the error insertion code EI<3:1>. The exclusive OR gate XOR62 may output a signal having a logic "low" level if the second bit S<2> of the syndrome signal S<3:1> and the second bit EI<2> of the error insertion code EI<3:1> have the same logic level and may output a signal having a logic "high" level if the second bit S<2> of the syndrome signal S<3:1> and the second bit EI<2> of the error insertion code EI<3:1> have different logic levels. The exclusive OR gate XOR63 may perform an exclusive OR operation of the third bit S<3> of the syndrome signal S<3:1> and the third bit EI<3> of the error insertion code EI<3:1>. The exclusive OR gate XOR63 may output a signal having a logic "low" level if the third bit S<3> of the syndrome signal S<3:1> and the third bit EI<3> of the error insertion code EI<3:1> have the same logic level and may output a signal having a logic "high" level if the third bit S<3> of the syndrome signal S<3:1> and the third bit EI<3> of the error insertion code EI<3:1> have different logic levels. The NOR gate NOR61 may output the verification signal VR having a logic "high" level if all of the output signals of the exclusive OR gates XOR61, XOR62 and XOR63 have a logic "low" level. The NOR gate NOR61 may output the verification signal VR having a logic "low" level if at least one of the output signals of the exclusive OR gates XOR61, XOR62 and XOR63 have a logic "high" level.

The verification signal generation circuit 6 may generate the verification signal VR having a logic "high" level if the syndrome signal S<3:1> and the error insertion code EI<3:1> have the same logic level combination. The verification signal generation circuit 6 may generate the verification signal VR having a logic "low" level if the syndrome signal S<3:1> and the error insertion code EI<3:1> have different logic level combinations.

The electronic device according to an embodiment may generate the error insertion code EI<3:1> using an error check matrix and may include errors into the data D<4:1> and the parity P<3:1> to generate the internal data ID<4:1> and the internal parity IP<3:1> according to a logic level combination of the error insertion code EI<3:1>. The electronic device according to an embodiment may generate the syndrome signal S<3:1> in response to the internal data ID<4:1> including an error and the internal parity IP<3:1> including an error and may verify whether an error correction operation is normally performed by the error check matrix according to identity or non-identity of the syndrome signal S<3:1> and the error insertion code EI<3:1>. That is, the electronic device according to an embodiment may generate an error at a desired location and may verify whether the error correction operation is normally performed by detecting whether the error is generated at the desired location.

According to the embodiments described above, an error of data may be generated by an error correction code (ECC) and it may be possible to verify whether an error correction operation using the ECC is normally performed by a syndrome signal which is generated from the data including the error.

Figure 10:
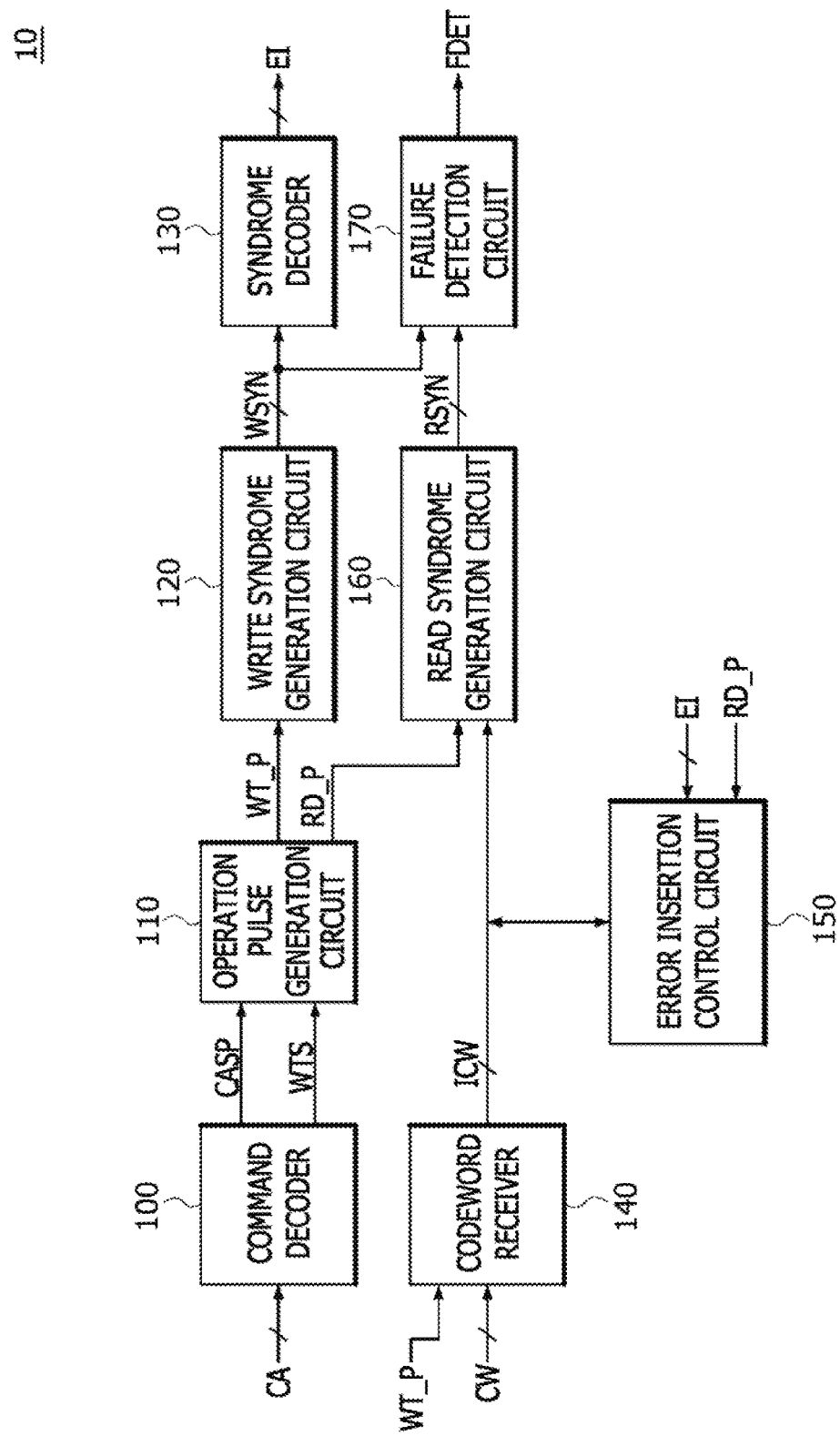
FIG. 10 is a block diagram illustrating a configuration of an electronic device according to another embodiment of the present disclosure.

FIG. 10 is a block diagram illustrating a configuration of an electronic device 10 according to another embodiment of the present disclosure. As illustrate in FIG. 10, the electronic device 10 may include a command decoder 100, an operation pulse generation circuit 110, a write syndrome generation circuit 120, a syndrome decoder 130, a codeword receiver 140, an error insertion control circuit 150, a read syndrome generation circuit 160, and a failure detection circuit 170.

The command decoder 100 may generate a column pulse CASP and a write flag WTS based on a control signal CA. The command decoder 100 may decode the control signal CA to generate the column pulse CASP and to set a logic level of the write flag WTS. The control signal CA may include a command and an address. The column pulse CASP may generate when a write operation or a read operation is performed. The write flag WTS may be set to have a first logic level when the write operation is performed and may be set to have a second logic level when the read operation is performed. In an embodiment, the first logic level may be set as a logic "high" level, and the second logic level may be set as a logic "low" level.

The operation pulse generation circuit 110 may generate a write pulse WT_P or a read pulse RD_P based on the column pulse CASP and the write flag WTS. The operation pulse generation circuit 110 may generate the write pulse WT_P when the column pulse CASP is created while the write flag WTS is set to have the first logic level during the write operation. The operation pulse generation circuit 110 may generate the read pulse RD_P when the column pulse CASP is created while the write flag WTS is set to have the second logic level during the read operation.

The write syndrome generation circuit 120 may generate a write syndrome WSYN based on the write pulse WT_P. The write syndrome generation circuit 120 may count the write pulse WT_P to control a logic level combination of bits included in the write syndrome WSYN. For example, if the write syndrome WSYN has three bits, the write syndrome WSYN may be counted to have logic level combinations of '001', '010', '011', '100', '101', '110', '111', . . . in sequence whenever the write pulse WT_P is inputted to the write syndrome generation circuit 120. In the logic level combinations of the write syndrome WSYN, '0' denotes a logic "low" level, and '1' denotes a logic "high" level. The write syndrome WSYN may be generated to be applied to an error correction code (ECC) scheme using a Hamming code. The Hamming code may be realized by an error check matrix for correcting data errors, the write syndrome WSYN may be realized to have bits having a logic level combination corresponding to a predetermined error check matrix. An error may be inserted into one of bits included in an internal codeword ICW according to a logic level combination of the write syndrome WSYN.

The syndrome decoder 130 may decode the write syndrome WSYN to generate an error insertion code EI. The syndrome decoder 130 may generate the error insertion code EI including bits having a logic level combination for inserting an error into one of bits included in the internal codeword ICW according to a logic level combination of bits included in the write syndrome WSYN. For example, when the write syndrome WSYN is generated to have 8 bits, the error insertion code EI having 136 bits may be generated to insert an error into one of bits included in the internal codeword ICW which is comprised of 128-bit data and 8-bit parity. The error insertion code EI may be set to include bits that correspond to respective ones of bits of the internal codeword ICW.

The codeword receiver 140 may generate the internal codeword ICW from a codeword CW based on the write pulse WT_P. The codeword CW may include data and a parity. The parity may be generated from a predetermined error check matrix to correct an error included in the data when the ECC is used. The codeword CW may be inputted to the electronic device 10 through a pad (not shown). The codeword receiver 140 may buffer the codeword CW to output the internal codeword ICW when the write pulse WT_P is created to perform the write operation.

The error insertion control circuit 150 may insert an error into the internal codeword ICW based on the read pulse RD_P and the error insertion code EI. The error insertion control circuit 150 may invert a logic level of one of bits included in the internal codeword ICW to insert an error into the internal codeword ICW according to the error insertion code EI when the read pulse RD_P is created to perform the read operation.

The read syndrome generation circuit 160 may generate a read syndrome RSYN based on the read pulse RD_P and the internal codeword ICW. The read syndrome generation circuit 160 may generate the read syndrome RSYN using the data and the parity included in the internal codeword ICW when the read pulse RD_P is created to perform the read operation. The read syndrome generation circuit 160 may generate the read syndrome RSYN from the data and the parity included in the internal codeword ICW with the ECC scheme using the Hamming code. In some embodiments, the read syndrome generation circuit 160 may receive data and a parity stored in a memory bank (71 of FIG. 16) to generate a syndrome for error correction.

The failure detection circuit 170 may generate a failure detection signal FDET based on the write syndrome WSYN and the read syndrome RSYN. The failure detection circuit 170 may generate the failure detection signal FDET including information on whether an error occurs in the read syndrome generation circuit 160 according to whether the write syndrome WSYN is identical to the read syndrome RSYN. The failure detection circuit 170 may generate the failure detection signal FDET having a first logic level when the write syndrome WSYN is identical to the read syndrome RSYN and may generate the failure detection signal FDET having a second logic level when the write syndrome WSYN is different from the read syndrome RSYN.

Figure 11:
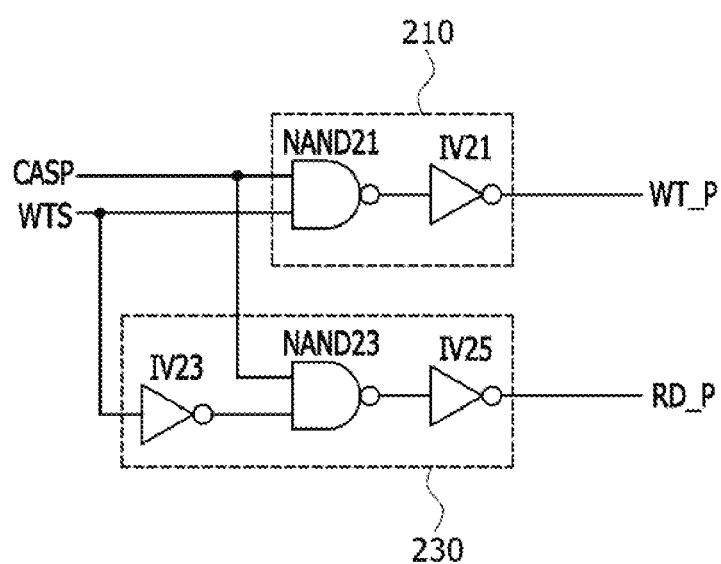
FIG. 11 is a circuit diagram illustrating an example of an operation pulse generation circuit included in the electronic device of FIG. 10.

FIG. 11 is a circuit diagram illustrating the operation pulse generation circuit 110. As illustrated in FIG. 11, the operation pulse generation circuit 110 may include a write pulse generation circuit 210 and a read pulse generation circuit 230. The write pulse generation circuit 210 may include a NAND gate NAND21 and an inverter IV21 and may perform a logical AND operation of the column pulse CASP and the write flag WTS to generate the write pulse WT_P. The write pulse generation circuit 210 may generate the write pulse WT_P having a logic "high" level when the column pulse CASP is created to have a logic "high" level while the write flag WTS is set to have a logic "high" level during the write operation. The read pulse generation circuit 230 may include inverters IV23 and IV25 and a NAND gate NAND23 and may perform a logical AND operation of the column pulse CASP and an inverted signal of the write flag WTS to generate the read pulse RD_P. The read pulse generation circuit 230 may generate the read pulse RD_P having a logic "high" level when the column pulse CASP is created to have a logic "high" level while the write flag WTS is set to have a logic "low" level during the read operation.

Figure 12:
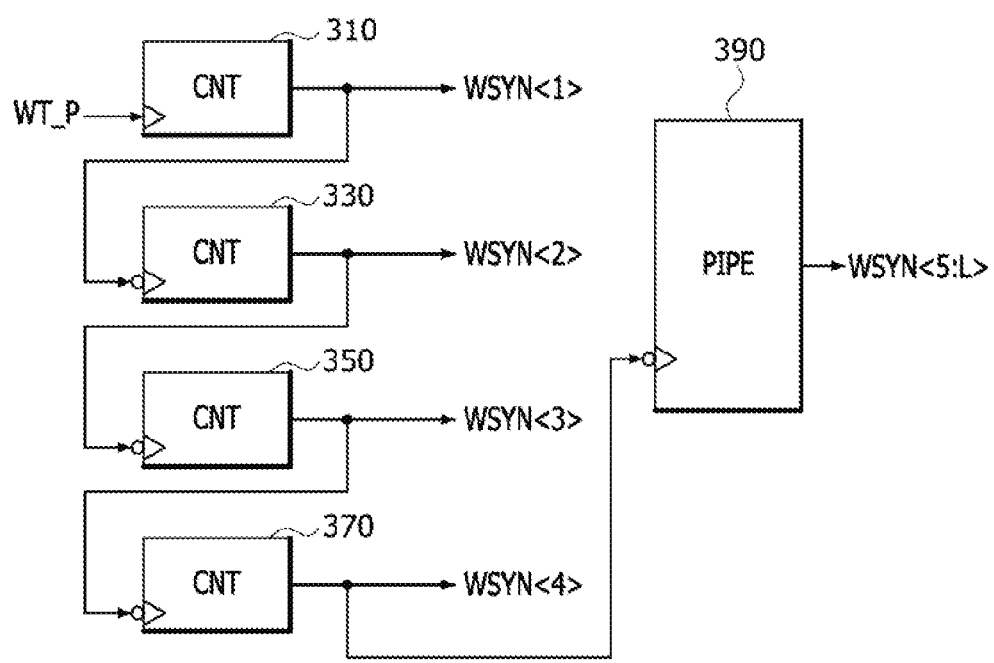
FIG. 12 is a block diagram illustrating an example of a write syndrome generation circuit included in the electronic device of FIG. 10.

FIG. 12 is a block diagram illustrating the write syndrome generation circuit 120. As illustrated in FIG. 12, the write syndrome generation circuit 120 may include a first counter 310, a second counter 330, a third counter 350, a fourth counter 370, and a pipe 390.

The first counter 310 may count the write pulse WT_P to generate a first bit WSYN<1> of the write syndrome WSYN. The first counter 310 may change a logic level of the first bit WSYN<1> of the write syndrome WSYN in synchronization with a point in time (hereinafter, referred to as a rising edge) when a level transition of the write pulse WT_P occurs from a logic "low" level into a logic "high" level.

The second counter 330 may count the first bit WSYN<1> of the write syndrome WSYN to generate a second bit WSYN<2> of the write syndrome WSYN. The second counter 330 may change a logic level of the second bit WSYN<2> of the write syndrome WSYN in synchronization with a point in time (hereinafter, referred to as a falling edge) when a level transition of the second bit WSYN<2> of the write syndrome WSYN occurs from a logic "high" level into a logic "low" level.

The third counter 350 may count the second bit WSYN<2> of the write syndrome WSYN to generate a third bit WSYN<3> of the write syndrome WSYN. The third counter 350 may change a logic level of the third bit WSYN<3> of the write syndrome WSYN in synchronization with a falling edge of the second bit WSYN<2> of the write syndrome WSYN.

The fourth counter 370 may count the third bit WSYN<3> of the write syndrome WSYN to generate a fourth bit WSYN<4> of the write syndrome WSYN. The fourth counter 370 may change a logic level of the fourth bit WSYN<4> of the write syndrome WSYN in synchronization with a falling edge of the third bit WSYN<3> of the write syndrome WSYN.

The pipe 390 may generate fifth to $L^{th}$ bits WSYN<5:L> of the write syndrome WSYN based on the fourth bit WSYN<4> of the write syndrome WSYN. The pipe 390 may be synchronized with a falling edge of the fourth bit WSYN<4> of the write syndrome WSYN to change a logic level combination of the fifth to $L^{th}$ bits WSYN<5:L> of the write syndrome WSYN.

Figure 13:
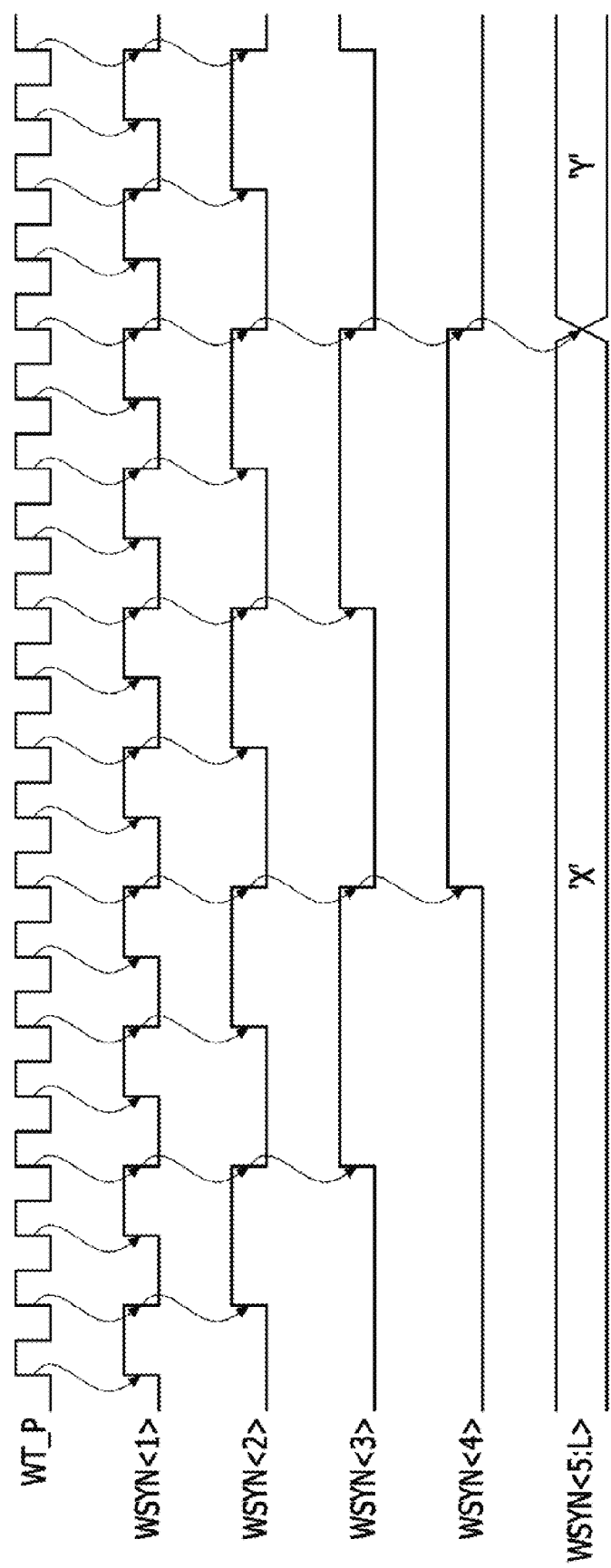
FIG. 13 is a timing diagram illustrating an operation of the write syndrome generation circuit shown in FIG. 12.

FIG. 13 is a timing diagram illustrating an operation of the write syndrome generation circuit 120 shown in FIG. 12. As illustrated in FIG. 13, a logic level of the first bit WSYN<1> of the write syndrome WSYN may change in synchronization with a rising edge of the write pulse WT_P, a logic level of the second bit WSYN<2> of the write syndrome WSYN may change in synchronization with a falling edge of the first bit WSYN<1> of the write syndrome WSYN, a logic level of the third bit WSYN<3> of the write syndrome WSYN may change in synchronization with a falling edge of the second bit WSYN<2> of the write syndrome WSYN, a logic level of the fourth bit WSYN<4> of the write syndrome WSYN may change in synchronization with a falling edge of the third bit WSYN<3> of the write syndrome WSYN, and a logic level combination of the fifth to $L^{th}$ bits WSYN<5:L> of the write syndrome WSYN may change from a logic level combination of "X" into a logic level combination of "Y" in synchronization with a falling edge of the fourth bit WSYN<4> of the write syndrome WSYN. In an embodiment, 'L' may be a natural number greater than 5.

Figure 14:
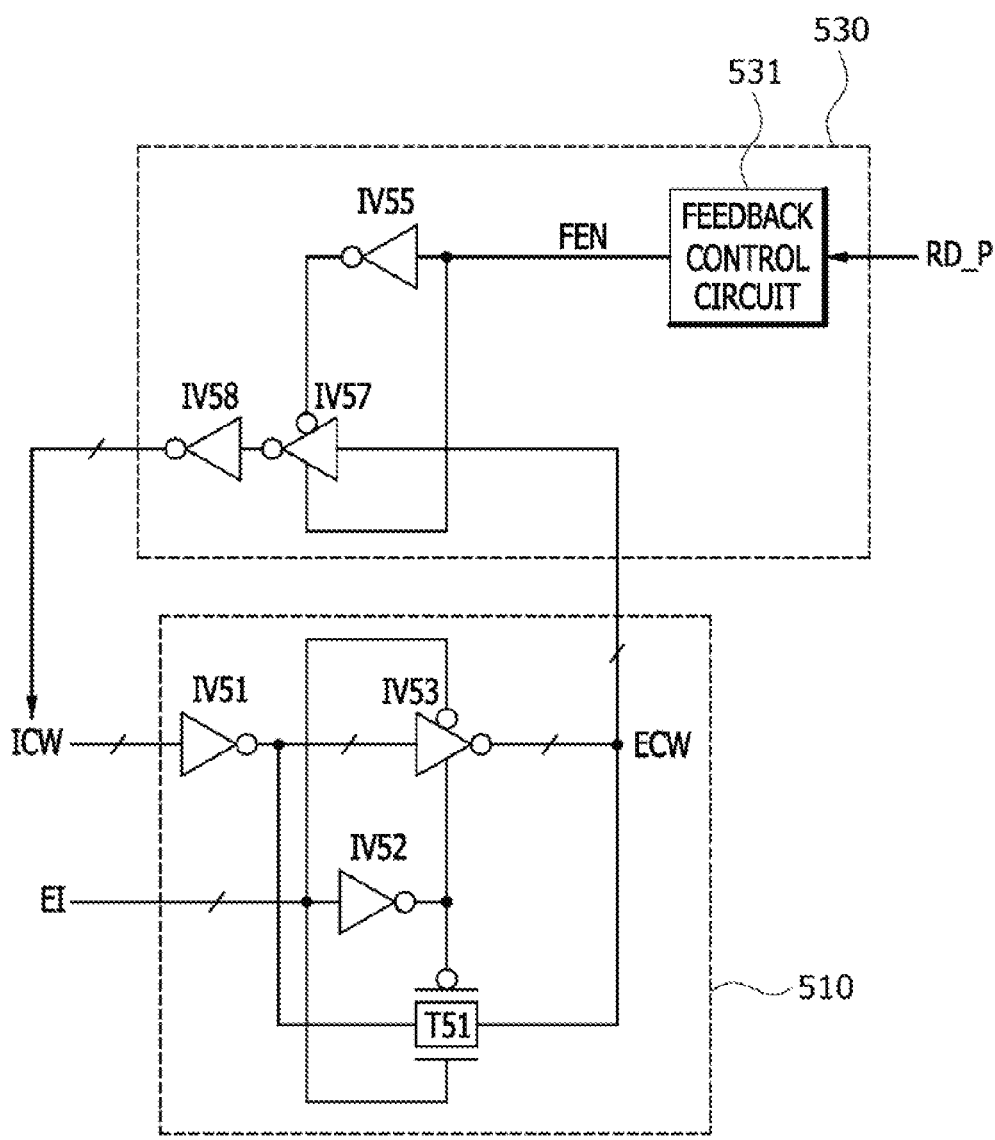
FIG. 14 illustrates an example of an error insertion control circuit included in the electronic device of FIG. 10.

FIG. 14 illustrates the error insertion control circuit 150. As illustrated in FIG. 14, the error insertion control circuit 150 may include an erroneous codeword generation circuit 510 and a codeword feedback circuit 530.

The erroneous codeword generation circuit 510 may include inverters IV51, IV52, and IV53 and a transfer gate T51. The inverter IV51 may inversely buffer the internal codeword ICW to output the inversely buffered signal of the internal codeword ICW. The inverter IV52 may inversely buffer the error insertion code EI to output the inversely buffered signal of the error insertion code EI. The inverter IV53 may inversely buffer an output signal of the inverter IV51 to generate an erroneous codeword ECW when the error insertion code EI has a logic "low" level. The transfer gate T51 may output an output signal of the inverter IV51 as the erroneous codeword ECW when the error insertion code EI has a logic "high" level. The erroneous codeword generation circuit 510 may buffer or inversely buffer the internal codeword ICW based on the error insertion code EI, thereby outputting the buffered signal of the inversely buffered signal of the internal codeword ICW as the erroneous codeword ECW. The erroneous codeword generation circuit 510 may buffer the internal codeword ICW to generate the erroneous codeword ECW when the error insertion code EI has a logic "low" level. The erroneous codeword generation circuit 510 may inversely buffer the internal codeword ICW to generate the erroneous codeword ECW when the error insertion code EI has a logic "high" level. The erroneous codeword generation circuit 510 may insert an error into the internal codeword ICW to generate the erroneous codeword ECW when the error insertion code EI has a logic "high" level.

The codeword feedback circuit 530 may include a feedback control circuit 531 and inverters IV55, IV57 and IV58. The feedback control circuit 531 may generate a feedback enablement signal FEN based on the read pulse RD_P. The feedback control circuit 531 may generate the feedback enablement signal FEN at a point in time when a predetermined feedback delay period elapses from a point in time when the read pulse RD_P is created to have a logic "high" level to perform the read operation. The inverter IV55 may inversely buffer the feedback enablement signal FEN to output the inversely buffered signal of the feedback enablement signal FEN. The inverter IV57 may inversely buffer the erroneous codeword ECW to output the inversely buffered signal of the erroneous codeword ECW when the feedback enablement signal FEN is generated to have a logic "high" level. The inverter IV58 may inversely buffer an output signal of the inverter IV57 to output the inversely buffered signal of the output signal of the inverter IV57 as the internal codeword ICW.

Although the error insertion control circuit 150 shown in FIG. 14 is illustrated as a single circuit, the error insertion control circuit 150 may be realized to include a plurality of circuits corresponding to the number of bits included in the error insertion code EI such that an error is inserted into each bit of the internal codeword ICW.

Figure 15:
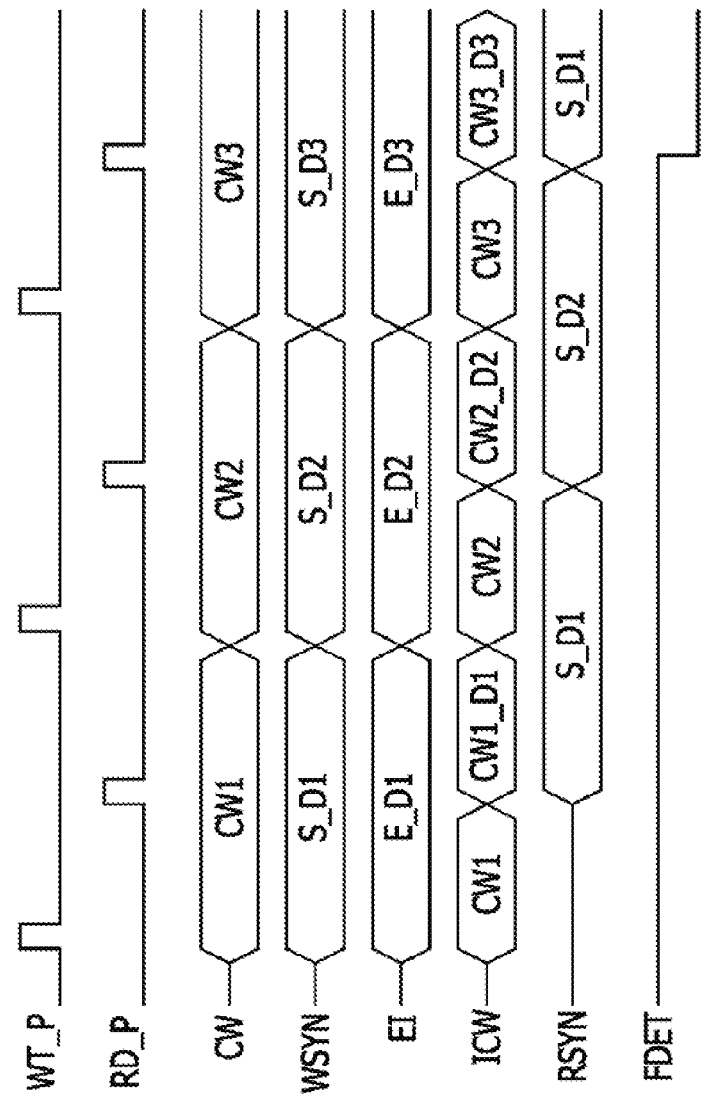
FIG. 15 is a timing diagram illustrating an operation of the electronic device shown in FIG. 10.

FIG. 15 is a timing diagram illustrating an operation of the electronic device 10.

As illustrated in FIG. 15, if a first codeword set CW1 is inputted to the electronic device 10 through the codeword CW and the write syndrome WSYN having a first syndrome set S_D1 is generated when the write pulse WT_P is created a first time, a first error insertion code set E_D1 may be generated based on the error insertion code EI. The first error insertion code set E_D1 may be generated to insert an error into a first bit D1 of the data included in the codeword CW. When the read pulse RD_P is created a first time, the first bit D1 of the data included in the codeword CW may be inverted by the error insertion code EI having the first error insertion code set E_D1 to generate the internal codeword ICW having a first erroneous codeword set CW1_D1. Because the write syndrome WSYN is identical to the read syndrome RSYN when the read syndrome RSYN is generated from the internal codeword ICW having the first erroneous codeword set CW1_D1 to have the first syndrome set S_D1, the failure detection signal FDET may maintain a logic "high" level.

As illustrated in FIG. 15, if a second codeword set CW2 is inputted to the electronic device 10 through the codeword CW and the write syndrome WSYN having a second syndrome set S_D2 is generated when the write pulse WT_P is created a second time, a second error insertion code set E_D2 may be generated based on the error insertion code EI. The second error insertion code set E_D2 may be generated to insert an error into a second bit D2 of the data included in the codeword CW. When the read pulse RD_P is created a second time, the second bit D2 of the data included in the codeword CW may be inverted by the error insertion code EI having the second error insertion code set E_D2 to generate the internal codeword ICW having a second erroneous codeword set CW2_D2. Because the write syndrome WSYN is identical to the read syndrome RSYN when the read syndrome RSYN is generated from the internal codeword ICW having the second erroneous codeword set CW2_D2 to have the second syndrome set S_D2, the failure detection signal FDET may maintain a logic "high" level.

As illustrated in FIG. 15, if a third codeword set CW3 is inputted to the electronic device 10 through the codeword CW and the write syndrome WSYN having a third syndrome set S_D3 is generated when the write pulse WT_P is created a third time, a third error insertion code set E_D3 may be generated based on the error insertion code EI. The third error insertion code set E_D3 may be generated to insert an error into a third bit D3 of the data included in the codeword CW. When the read pulse RD_P is created a third time, the third bit D3 of the data included in the codeword CW may be inverted by the error insertion code EI having the third error insertion code set E_D3 to generate the internal codeword ICW having a third erroneous codeword set CW3_D3. Because the write syndrome WSYN is different from the read syndrome RSYN when the read syndrome RSYN is generated from the internal codeword ICW having the third erroneous codeword set CW3_D3 to have the first syndrome set S_D1, a logic level of the failure detection signal FDET may change from a logic "high" level into a logic "low" level. If the failure detection signal FDET is generated to have a logic "low" level, it means that a failure occurs when the read syndrome generation circuit 160 generating the read syndrome RSYN performs an error correction operation.

As described above, the electronic device 10 may insert an error into the internal codeword ICW generated from the codeword CW provided by an external device, thereby more readily verifying failure of a circuit that performs an error correction operation using the read syndrome RSYN generated from the internal codeword ICW in which an error is inserted. In addition, the electronic device 10 may perform an operation for verifying failure of the error correction operation without using data and a parity stored in the memory bank (710 of FIG. 16). Accordingly, it may possible to reduce power consumption of the electronic device 10.

Figure 16:
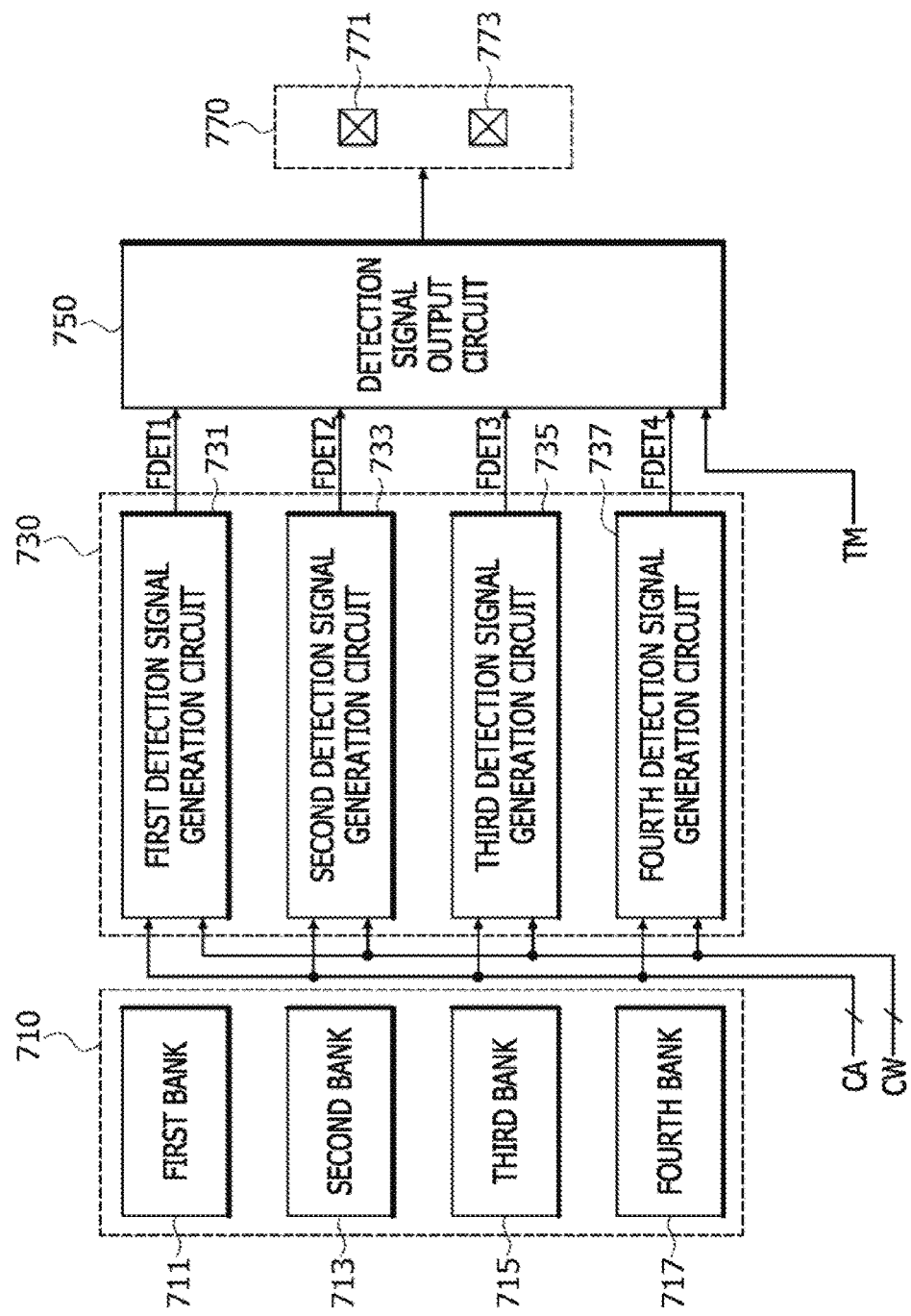
FIG. 16 is a block diagram illustrating a configuration of an electronic device according to yet another embodiment of the present disclosure.

FIG. 16 is a block diagram illustrating a configuration of an electronic device 70 according to yet another embodiment of the present disclosure. As illustrated in FIG. 16, the electronic device 70 may include a memory bank 710, a detection signal generation circuit 730, a detection signal output circuit 750, and an output pad part 770. The memory bank 710 may include a first bank 711, a second bank 713, a third bank 715, and a fourth bank 717. The detection signal generation circuit 730 may include a first detection signal generation circuit 731, a second detection signal generation circuit 733, a third detection signal generation circuit 735, and a fourth detection signal generation circuit 737.

The first detection signal generation circuit 731 may receive data and a parity stored in a memory cell array (not shown) included in the first bank 711 and may correct an error included in the data and the parity which are received from the first bank 711. The first detection signal generation circuit 731 may be realized using the electronic device 10 illustrated in FIG. 10. The first detection signal generation circuit 731 may insert an error into an internal codeword, which is generated from a codeword CW provided by an external device, based on a control signal CA and may generate a first failure detection signal FDET1 using a syndrome generated from the internal codeword in which an error is inserted.

The second detection signal generation circuit 733 may receive data and a parity stored in a memory cell array (not shown) included in the second bank 713 and may correct an error included in the data and the parity which are received from the second bank 713. The second detection signal generation circuit 733 may be realized using the electronic device 10 illustrated in FIG. 10. The second detection signal generation circuit 733 may insert an error into an internal codeword, which is generated from the codeword CW provided by the external device, based on the control signal CA and may generate a second failure detection signal FDET2 using a syndrome generated from the internal codeword in which an error is inserted.

The third detection signal generation circuit 735 may receive data and a parity stored in a memory cell array (not shown) included in the third bank 715 and may correct an error included in the data and the parity which are received from the third bank 715. The third detection signal generation circuit 735 may be realized using the electronic device 10 illustrated in FIG. 10. The third detection signal generation circuit 735 may insert an error into an internal codeword, which is generated from the codeword CW provided by the external device, based on the control signal CA and may generate a third failure detection signal FDET3 using a syndrome generated from the internal codeword in which an error is inserted.

The fourth detection signal generation circuit 737 may receive data and a parity stored in a memory cell array (not shown) included in the fourth bank 717 and may correct an error included in the data and the parity which are received from the fourth bank 717. The fourth detection signal generation circuit 737 may be realized using the electronic device 10 illustrated in FIG. 10. The fourth detection signal generation circuit 737 may insert an error into an internal codeword, which is generated from the codeword CW provided by the external device, based on the control signal CA and may generate a fourth failure detection signal FDET4 using a syndrome generated from the internal codeword in which an error is inserted.

The first to fourth detection signal generation circuits 731, 733, 735 and 737 may be realized using the electronic device 10 illustrated in FIG. 10. The first to fourth detection signal generation circuits 731, 733, 735 and 737 may be realized to share the command decoder 100, the operation pulse generation circuit 110, the write syndrome generation circuit 120, and the syndrome decoder 130, which are included in the electronic device 10 shown in FIG. 10, with each other.

The detection signal output circuit 750 may sequentially output the first to fourth failure detection signals FDET1, FDET2, FDET3 and FDET4 to the output pad part 770 based on a test mode signal TM. The test mode signal TM may be activated to perform a test to output the first to fourth failure detection signals FDET1, FDET2, FDET3 and FDET4 to the output pad part 770.

The output pad part 770 may include a first output pad 771 and a second output pad 773. The first to fourth failure detection signals FDET1, FDET2, FDET3 and FDET4 outputted from the first to fourth detection signal generation circuits 731, 733, 735 and 737 may be outputted through the first output pad 771 and the second output pad 773 included in the output pad part 770.

Figure 17:
FIGS. 17 and 18 illustrate an operation of the electronic device shown in FIG. 16.
Figure 18:
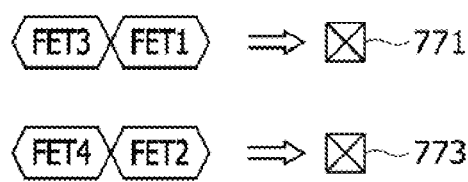

FIGS. 17 and 18 illustrate an operation of the detection signal output circuit 750.

As illustrated in FIG. 17, the detection signal output circuit 750 may receive the first to fourth failure detection signals FDET1, FDET2, FDET3 and FDET4 from the first to fourth detection signal generation circuits 731, 733, 735 and 737 and may sequentially output the fourth failure detection signal FDET4, the third failure detection signal FDET3, the second failure detection signal FDET2, and the first failure detection signal FDET1 through the first output pad 771. Accordingly, whether an error correction operation performed in each of the first to fourth detection signal generation circuits 731, 733, 735 and 737 is failed may be verified at a time through an operation of the electronic device 70.

As illustrated in FIG. 18, the detection signal output circuit 750 may receive the first and third failure detection signals FDET1 and FDET3 from the first and third detection signal generation circuits 731 and 735 and may sequentially output the third and first failure detection signals FDET3 and FDET1 through the first output pad 771. In addition, the detection signal output circuit 75 may receive the second and fourth failure detection signals FDET2 and FDET4 from the second and fourth detection signal generation circuits 733 and 737 and may sequentially output the fourth and second failure detection signals FDET4 and FDET2 through the second output pad 773. Accordingly, whether an error correction operation performed in each of the first to fourth detection signal generation circuits 731, 733, 735 and 737 is failed may be verified at a time through an operation of the electronic device 70.

According to an above embodiment, an error may be inserted into a codeword provided by an external device to verify more readily whether an error correction operation performed using a syndrome generated from the codeword including the error has failed. In addition, according to an above embodiment, whether the error correction operation has failed may be verified using the codeword provided by the external device without executing a read operation and a write operation of data stored in a memory bank. Thus, it may possible to reduce power consumption of an electronic device.

Figure 19:
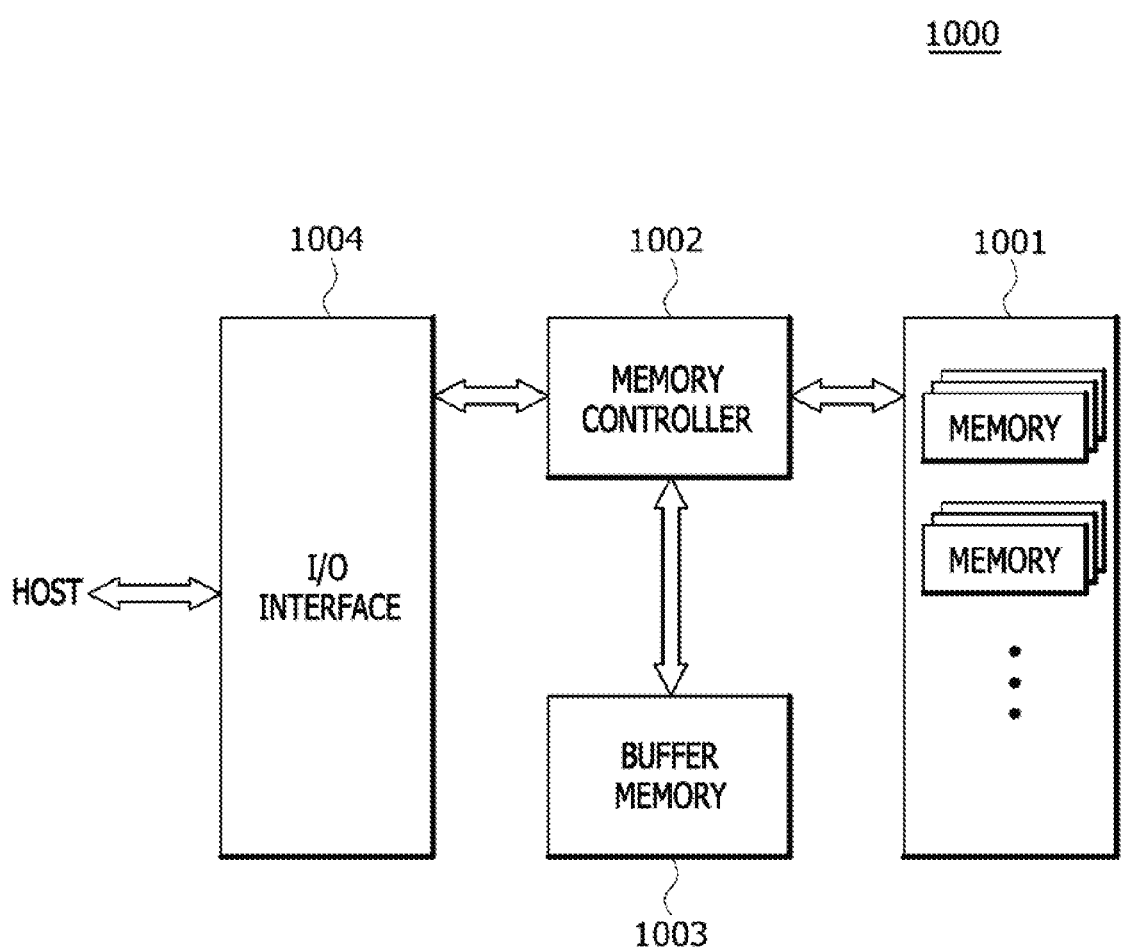
FIG. 19 is a block diagram illustrating a configuration of an electronic system employing the electronic device illustrated in FIG. 1.

The electronic devices described with reference to FIGS. 1 to 18 may be applied to an electronic system that includes a memory system, a graphic system, a computing system, a mobile system, or the like. For example, as illustrated in FIG. 19, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal outputted from the memory controller 1002. Meanwhile, the data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 10 illustrates the memory controller 1002 with a single block, the memory controller 1002 may include one controller for controlling the data storage circuit 1001 and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data outputted from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

Figure 20:
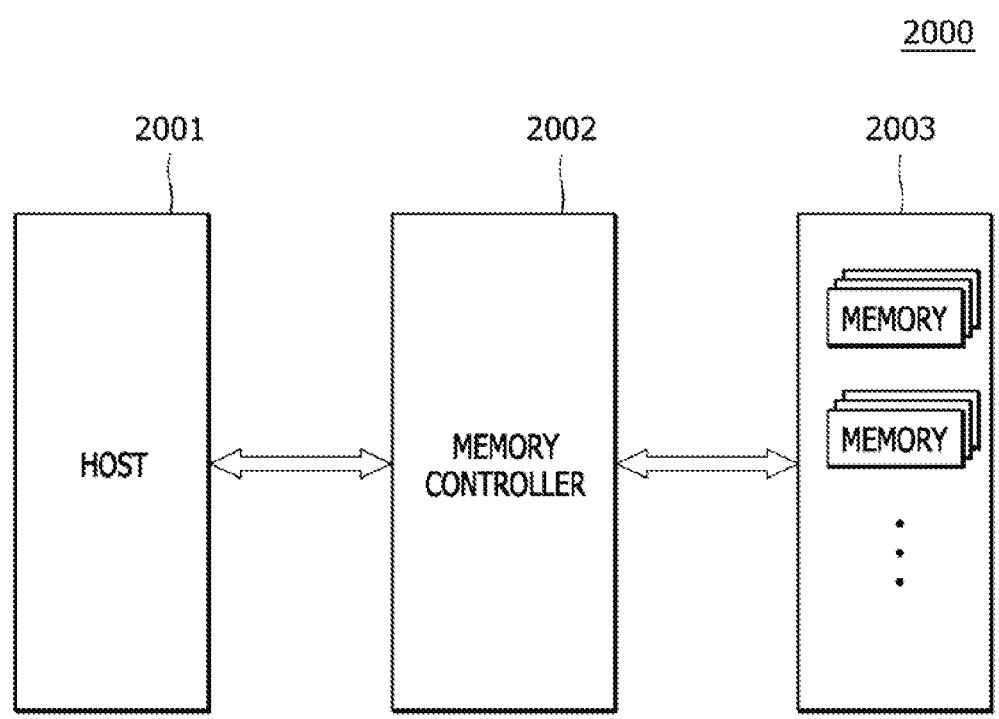
FIG. 20 is a block diagram illustrating a configuration of an electronic system employing the electronic device illustrated in FIG. 1.

Referring to FIG. 20, an electronic system 2000 according to an embodiment may include a host 2001, a memory controller 2002 and a data storage circuit 2003.

The host 2001 may output a request signal and data to the memory controller 2002 to access to the data storage circuit 2003. The memory controller 2002 may supply the data, a data strobe signal, a command, an address and a clock signal to the data storage circuit 2003 in response to the request signal, and the data storage circuit 2003 may execute a write operation or a read operation in response to the command. The host 2001 may transmit the data to the memory controller 2002 to store the data into the data storage circuit 2003. In addition, the host 2001 may receive the data outputted from the data storage circuit 2003 through the memory controller 2002. The host 2001 may include a circuit that corrects errors of the data using an error correction code (ECC) circuit.

The memory controller 2002 may act as an interface that connects the host 2001 to the data storage circuit 2003 for communication between the host 2001 and the data storage circuit 2003. The memory controller 2002 may receive the request signal and the data from the host 2001 and may generate and supply the data, the data strobe signal, the command, the address and the clock signal to the data storage circuit 2003 in order to control operations of the data storage circuit 2003. In addition, the memory controller 2002 may supply the data outputted from the data storage circuit 2003 to the host 2001.

The data storage circuit 2003 may include a plurality of memories. The data storage circuit 2003 may receive the data, the data strobe signal, the command, the address and the clock signal from the memory controller 2002 to execute the write operation or the read operation. Each of the memories included in the data storage circuit 2003 may include a circuit that corrects the errors of the data using an error correction code (ECC) circuit. The data storage circuit 2003 may include the electronic devices illustrated in FIGS. 1 to 18.

In some embodiments, the electronic system 2000 may be realized to selectively operate any one of the ECC circuits included in the host 2001 and the data storage circuit 2003. Alternatively, the electronic system 2000 may be realized to simultaneously operate all of the ECC circuits included in the host 2001 and the data storage circuit 2003. The host 2001 and the memory controller 2002 may be realized in a single chip according to the embodiments. The memory controller 2002 and the data storage circuit 2003 may be realized in a single chip according to the embodiments.

What is claimed is:

1. An electronic device comprising:
    a syndrome decoder configured to generate an error insertion code from a write syndrome generated based on a write pulse;
    an error insertion control circuit configured to insert an error into an internal codeword according to the error insertion code based on a read pulse; and
    a failure detection circuit configured to compare the write syndrome with a read syndrome generated from the internal codeword to generate a failure detection signal.

2. The electronic device of claim 1,
    wherein the write pulse is generated to perform a write operation;
    wherein the read pulse is generated to perform a read operation; and
    wherein the write pulse and the read pulse are generated by decoding a control signal.

3. The electronic device of claim 1, wherein the write syndrome is generated by counting the write pulse.

4. The electronic device of claim 1,
    wherein the internal codeword is generated by buffering a codeword based on the write pulse; and
    wherein the internal codeword includes data and a parity.

5. The electronic device of claim 1, wherein the error insertion control circuit inverts a level of at least one bit included in the internal codeword based on the error insertion code.

6. The electronic device of claim 1, wherein the error insertion control circuit inverts a level of at least one bit included in the internal codeword based on the error insertion code when the read pulse is generated to perform a read operation.

7. The electronic device of claim 1, wherein the error insertion control circuit includes:
    an erroneous codeword generation circuit configured to perform at least one of buffer and an inverse buffer on the internal codeword based on the error insertion code to generate an erroneous codeword; and
    a codeword feedback circuit configured to feedback the erroneous codeword as the internal codeword based on the read pulse.

8. The electronic device of claim 1, wherein the read syndrome is generated from data and a parity included in the internal codeword using an error check matrix used for an error correction code (ECC) scheme with a hamming code.

9. The electronic device of claim 1, further comprising a read syndrome generation circuit configured to generate the read syndrome from data and a parity included in the internal codeword,
wherein the failure detection signal includes information on whether an error correction operation of the read syndrome generation circuit has failed.

10. An electronic device comprising:
    a syndrome decoder configured to generate an error insertion code from a write syndrome generated by counting a write pulse;
    an error insertion control circuit configured to invert a level of at least one bit included in an internal codeword according to the error insertion code based on a read pulse;
    a read syndrome generation circuit configured to generate a read syndrome from data and a parity included in the internal codeword; and
    a failure detection circuit configured to compare the write syndrome with the read syndrome to generate a failure detection signal.

11. The electronic device of claim 10,
    wherein the write pulse is generated to perform a write operation;
    wherein the read pulse is generated to perform a read operation; and
    wherein the write pulse and the read pulse are generated by decoding a control signal.

12. The electronic device of claim 10, wherein the internal codeword is generated by buffering a codeword based on the write pulse.

13. The electronic device of claim 10, wherein the error insertion control circuit includes:
    an erroneous codeword generation circuit configured to perform at least one of buffering and inversely buffering the internal codeword based on the error insertion code to generate an erroneous codeword; and
    a codeword feedback circuit configured to feedback the erroneous codeword as the internal codeword based on the read pulse.

14. The electronic device of claim 10, wherein the read syndrome is generated using an error check matrix used for an error correction code (ECC) scheme with a hamming code.

15. An electronic device comprising:
    a first detection signal generation circuit configured to generate an error insertion code from a write syndrome generated based on a write pulse, configured to insert an error into a first internal codeword according to the error insertion code based on a read pulse, and configured to compare the write syndrome with a first read syndrome generated from the first internal codeword to generate a first failure detection signal;
    a second detection signal generation circuit configured to insert an error into a second internal codeword according to the error insertion code based on the read pulse and configured to compare the write syndrome with a second read syndrome generated from the second internal codeword to generate a second failure detection signal; and
    a detection signal output circuit configured to sequentially output the first and second failure detection signals to at least one pad.

16. The electronic device of claim 15, wherein the first detection signal generation circuit is configured to receive first data and a first parity stored in a first memory cell array included in a first bank to correct an error included in the first data and the first parity.

17. The electronic device of claim 16, wherein the second detection signal generation circuit is configured to receive second data and a second parity stored in a second memory cell array included in a second bank to correct an error included in the second data and the second parity.

* * * * *